United States Patent
Hoshi

(10) Patent No.: US 11,133,385 B2
(45) Date of Patent: Sep. 28, 2021

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 5 days.

(21) Appl. No.: 16/807,127

(22) Filed: Mar. 2, 2020

(65) Prior Publication Data
US 2020/0328274 A1 Oct. 15, 2020

(30) Foreign Application Priority Data
Apr. 15, 2019 (JP) .............................. JP2019-077330

(51) Int. Cl.
*H01L 29/06* (2006.01)
*H01L 29/423* (2006.01)
(Continued)

(52) U.S. Cl.
CPC ...... *H01L 29/0696* (2013.01); *H01L 29/1095* (2013.01); *H01L 29/4238* (2013.01); *H01L 29/7804* (2013.01); *H01L 29/1608* (2013.01)

(58) Field of Classification Search
CPC ............. H01L 29/0696; H01L 29/1095; H01L 29/7375; H01L 29/7393–7395; H01L 29/7397; H01L 29/66325; H01L 29/66333–66348; H01L 29/4238; H01L 29/7804; H01L 29/1608; H01L 29/0878; H01L 29/0623; H01L 29/66734; H01L 29/7813; H01L 29/7815; H01L 27/0207; H01L 27/0255; H01L 27/0296;
(Continued)

(56) References Cited

U.S. PATENT DOCUMENTS 6,633,473 B1* 10/2003 Tomomatsu ........ H01L 29/7395
361/93.7
8,169,029 B2* 5/2012 Wu .......................... H01L 24/05
257/368
(Continued)

FOREIGN PATENT DOCUMENTS

| JP | 2017079324 A | 4/2017 |
|---|---|---|
| JP | 2018107331 A | 7/2018 |
| WO | 2018135147 A1 | 7/2018 |

*Primary Examiner* — Jonathan Han
(74) *Attorney, Agent, or Firm* — Rabin & Berdo, P.C.

(57) ABSTRACT

A region of a portion directly beneath an OC pad is a sensing effective region where unit cells of a current sensing portion are disposed. Directly beneath the OC pad, a region surrounding a periphery of the sensing effective region is a sensing non-operating region in which no unit cells of the current sensing portion are disposed. In the sensing non-operating region, a first p-type base region that floats is provided in a surface region of the front surface of the semiconductor substrate and is separated from a second p-type base region of the sensing effective region by an n⁻-type region that surrounds a periphery of the sensing effective region. The n⁻-type region has a surface area that is greater than that of the sensing effective region. A distance between the first and the second p-type base regions is at least 0.1 μm and is as small as possible.

9 Claims, 12 Drawing Sheets

(51) Int. Cl.
*H01L 29/78* (2006.01)
*H01L 29/10* (2006.01)
*H01L 29/16* (2006.01)

(58) Field of Classification Search
CPC ... H01L 27/088; H01L 22/34; H01L 29/0684; H01L 29/0615
USPC ... 257/E29.027–E29.028, E29.066–E29.067, 257/E29.194–E29.202
See application file for complete search history.

(56) References Cited

U.S. PATENT DOCUMENTS

| | | | |
|---|---|---|---|
| 2017/0111037 A1* | 4/2017 | Shiigi | H01L 29/1608 |
| 2018/0183427 A1* | 6/2018 | Nakajima | H01L 29/7815 |
| 2019/0131443 A1 | 5/2019 | Hoshi et al. | |

* cited by examiner

SEMICONDUCTOR DEVICE

CROSS REFERENCE TO RELATED APPLICATIONS

This application is based upon and claims the benefit of priority of the prior Japanese Patent Application No. 2019-077330, filed on Apr. 15, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs) that have an insulated gate formed by a three-layered structure including a metal, an oxide film, and a semiconductor material. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Further, MOSFETs structurally differ from IGBTs, have a built-in parasitic diode formed by a pn junction between a p-type base region and an n$^-$-type drift region, and may use this parasitic diode as a free-wheeling diode for protecting the MOSFET. Therefore, instances in in which a MOSFET is used as an inverter device are gaining attention in terms of being economical since no external free-wheeling diode needs to be connected to the MOSFET.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon (hereinafter, wide bandgap semiconductor material).

A structure of a conventional semiconductor device will described taking an n-channel MOSFET that uses silicon carbide (SiC) as a wide bandgap material as an example. FIG. 13 is a plan view of a layout when the conventional semiconductor device is viewed from a front side of a semiconductor substrate. In FIG. 13, a p-type base region 134b of a sensing effective region 112a and a p-type base region 134b' of a main non-operating region 101b are indicated by mutually differing hatching. FIGS. 14 and 15 are cross-sectional views of a structure of an active region in FIG. 13.

FIG. 14 depicts cross-sectional view of a structure of a main effective region 101a and a current sensing portion 112 (cross-sectional view along cutting line X101-X102-X103-X104-X105). FIG. 15 depicts a cross-sectional view of a structure of the main effective region 101a, the sensing effective region 112a and a temperature sensing portion 113 (cross-sectional view along cutting line X101-X102, cutting line X104-X105, and cutting line Y101-Y102).

A conventional semiconductor device 120 depicted in FIGS. 13 to 15 has in an active region 101 of a single semiconductor substrate 110 containing silicon carbide, a main semiconductor element 111 and one or more circuit portions for protecting/controlling the main semiconductor element 111. The main semiconductor element 111 is a vertical MOSFET and is configured by plural unit cells (functional units: not depicted) disposed adjacent to each other in an effective region (hereinafter, main effective region) 101a of the active region 101.

A source pad 121a of the main semiconductor element 111 is provided on a front surface of the semiconductor substrate 110, in the main effective region 101a. The circuit portions for protecting/controlling the main semiconductor element 111 are disposed in a region (hereinafter, main non-operating region) 101b of the active region 101, excluding the main effective region 101a. No unit cells of the main semiconductor element 111 are disposed in the main non-operating region 101b.

A surface area of the main non-operating region 101b is large as compared to a surface area of a main non-operating region of a semiconductor device (semiconductor device in which only a gate pad is disposed in the main non-operating region) without the circuit portions for protecting/controlling the main semiconductor element 111. The circuit portions for protecting/controlling the main semiconductor element 111, for example, may be high-function portions such as the current sensing portion 112, the temperature sensing portion 113, an over-voltage protecting portion (not depicted), and an arithmetic circuit portion (not depicted).

The current sensing portion 112 is a vertical MOSFET that includes unit cells having a configuration similar to a configuration of the unit cells (functional units of the element) of the main semiconductor element 111, of a quantity fewer than a quantity of the unit cells in the main semiconductor element 111. The current sensing portion 112 is disposed separated from the main semiconductor element 111. The current sensing portion 112 operates under conditions identical to those of the main semiconductor element 111 and detects overcurrent (OC) flowing in the main semiconductor element 111.

The unit cells of the current sensing portion 112 are disposed in a region (hereinafter, sensing effective region) 112a of a portion of the current sensing portion 112 directly beneath an electrode pad (hereinafter, OC pad) 12. A region (hereinafter, sensing non-operating region) 112b directly beneath the OC pad 122 and excluding the sensing effective region 112a is a region in which no unit cells of the current sensing portion 112 are disposed and does not function as the current sensing portion 112.

In substantially the entire sensing non-operating region 112b, the p-type base region 134b' is provided in a surface region of the semiconductor substrate 110. A p$^+$-type region 162b' is provided between the p-type base region 134b' and an n$^-$-type drift region 132. The p-type base region 134b' and the p$^+$-type region 162b' of the sensing non-operating region 112b are separated from the sensing effective region 112a to a greater extent than is an n$^-$-type region 132b of a surface region of the semiconductor substrate 110.

The p-type base region 134b' of the sensing non-operating region 112b is connected to a p-type base region 134a of the main semiconductor element 111 and is fixed at a source potential of the main semiconductor element 111. Further, the p-type base region 134b' and the p$^+$-type region 162b' of the sensing non-operating region 112b extend throughout a region, excluding the sensing effective region 112a of the main non-operating region 101b and are disposed directly beneath electrode pads other than the source pad 121a.

The electrode pads other than the source pad 121a are provided on the front surface of the semiconductor substrate 110, in the main non-operating region 101b. In FIG. 13, the source pad 121a, a gate pad 121b, the OC pad 122, and electrode pads (an anode pad 123a and a cathode pad 123b) of the temperature sensing portion 113 are indicated by S, G, OC, A, and K, respectively. Reference numeral 102 is an edge termination region.

Reference characters 133a to 150a, 161a, 162a are parts of a trench-gate MOSFET configuring the main semiconductor element 111. Reference characters 133b to 150b, 161b, 162b are parts of a trench-gate MOSFET configuring the current sensing portion 112. Reference numerals 131, 132, 151 are respectively an n$^+$-type drain region, an n$^-$-type drift region, and a drain electrode common to the main semiconductor element 111 and the current sensing portion 112. Reference characters 180a to 180c are a field insulating film.

Further, as compared to a planar gate structure in which a channel is formed along the front surface of the semiconductor substrate accompanying increasing current, a trench gate structure in which a channel (inverse layer) is formed in a direction orthogonal to the front surface of the semiconductor substrate, along a side wall of a trench is advantageous in terms of cost. A reason for this is that a trench gate structure enables unit cell (configuration unit of an element) density per unit area to be increased and thereby, enables current density per unit area to be increased.

A rate of temperature rise relative to a volume occupied by the unit cells increases by an extent to which device current density is increased and therefore, to enhance discharge efficiency and stabilize reliability, a double-sided cooling structure is necessary. Further, with consideration of reliability, on a single semiconductor substrate with a vertical MOSFET that is a main semiconductor element, a high-function structure in which high-function portions such as the current sensing portion, the temperature sensing portion, and the over-voltage protecting portion have to be disposed as circuit portions for protecting/controlling a main semiconductor element.

As for examples of the conventional semiconductor device, a device has been proposed in which on a single semiconductor substrate that has a main semiconductor element having a planar gate structure, a main non-operating region is provided in which high-function portions such as a current sensing portion, a temperature sensing portion and an over-voltage protecting portion are disposed (for example, refer to Japanese Laid-Open Patent Publication No. 2017-079324, International Publication No. WO 2018/135147). In Japanese Laid-Open Patent Publication No. 2017-079324, International Publication No. WO 2018/135147, a configuration is disclosed in which electrode pads other than a source pad and an OC pad are disposed collectively at one edge of the semiconductor substrate.

As for another example of the conventional semiconductor device, a semiconductor device having plural current sensing portions and main semiconductor elements having a trench gate structure provided on a single semiconductor substrate has been proposed in which the current sensing portions are respectively disposed in the main semiconductor elements (for example, refer to Japanese Laid-Open Patent Publication No. 2018-107331). In Japanese Laid-Open Patent Publication No. 2018-107331, a configuration is disclosed in which OC pads of the current sensing portions are disposed collectively at one edge of the semiconductor substrate.

SUMMARY OF THE INVENTION

According to an embodiment of the invention a semiconductor device includes a semiconductor substrate containing a semiconductor having a bandgap wider than that of silicon, and having a first main surface and a second main surface opposite to the first main surface, the semiconductor substrate having first and second effective regions and a non-operating region that excludes the first and second effective regions; a first first-conductivity-type region of a first conductivity type, provided in the semiconductor substrate; a first second-conductivity-type region of a second conductivity type, provided between the first main surface of the semiconductor substrate and the first first-conductivity-type region; a first insulated gate field effect transistor provided in the first effective region and having the first first-conductivity-type region as a drift region and the first second-conductivity-type region as a base region, the first insulated gate field effect transistor having a plurality of unit cells each having a cell structure; a first source pad of the first insulated gate field effect transistor, provided on the first main surface of the semiconductor substrate and electrically connected to the first second-conductivity-type region; a second second-conductivity-type region of the second conductivity type, provided between the first main surface of the semiconductor substrate and the first first-conductivity-type region, in a region different from the first second-conductivity-type region; a second insulated gate field effect transistor, provided in the second effective region and having the first first-conductivity-type region as a drift region and the second second-conductivity-type region as a base region, the second insulated gate field effect transistor having a plurality of unit cells each having a cell structure same as the cell structure of each of the unit cells of the first insulated gate field effect transistor, a quantity of the plurality of unit cells of the second insulated gate field effect transistor being smaller than a quantity of the plurality of unit cells of the first insulated gate field effect transistor; a second source pad of the second insulated gate field effect transistor, provided on the first main surface of the semiconductor substrate separate from the first source pad and electrically connected to the second second-conductivity-type region; a third second-conductivity-type region of the second conductivity type having a floating potential and surrounding a periphery of the second effective region, the third second-conductivity-type region being provided between the first main surface of the semiconductor substrate and the first first-conductivity-type region, separate from the first effective region and the second effective region, in the non-operating region; and a drain electrode common to the first insulated gate field effect transistor and the second insulated gate field effect transistor and electrically connected to the second main surface of the semiconductor substrate.

In the embodiment, the semiconductor device further includes a second first-conductivity-type region of the first conductivity type, surrounding a periphery of the second second-conductivity-type region and being provided between the second second-conductivity-type region and the third second-conductivity-type region. A surface area of the second first-conductivity-type region is greater than a surface area of the second effective region.

In the embodiment, a length of an interval between the second second-conductivity-type region and the third second-conductivity-type region in a direction parallel to the first main surface is at least 0.1 µm.

In the embodiment, the second effective region is provided directly beneath the second source pad, and the third second-conductivity-type region is provided directly beneath the second source pad and is free of the second effective region.

In the embodiment, the semiconductor device further includes one or more electrode pads each provided on the first main surface of the semiconductor substrate in the non-operating region, separate from the first source pad and the second source pad; and a fourth second-conductivity-type region of the second conductivity type, electrically connected to the first second-conductivity-type region and provided between the first main surface of the semiconductor substrate and the first first-conductivity-type region so as to be directly beneath all of the one or more electrode pads and separate from the third second-conductivity-type region.

In the embodiment, the one or more electrode pads include a gate pad of the first insulated gate field effect transistor.

In the embodiment, the semiconductor device further includes, a diode that detects a temperature of the first insulated gate field effect transistor. The one or more electrode pads include an electrode pad of the diode.

In the embodiment, the semiconductor device further includes a diode that protects the first insulated gate field effect transistor from overvoltage. The one or more electrode pads include an electrode pad of the diode.

In the embodiment, the second insulated gate field effect transistor detects overcurrent flowing in the first insulated gate field effect transistor.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
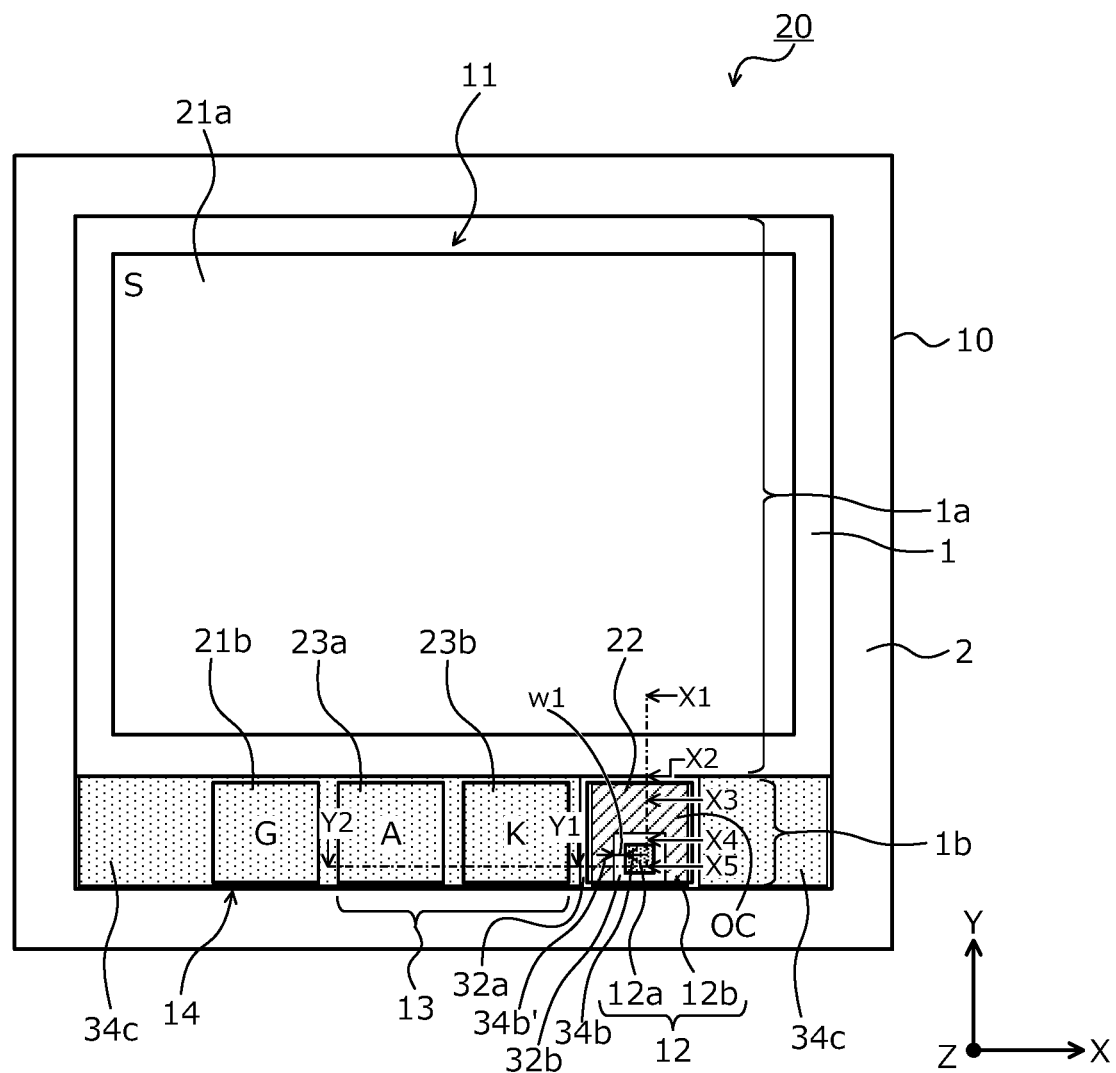
FIG. 1 is a plan view of a layout when a semiconductor device according to a first embodiment is viewed from a front side of a semiconductor substrate.

First, problems associated with the conventional techniques will be discussed. In the conventional semiconductor device 120, the p-type base region 134b' of the main non-operating region 101b is electrically connected to the source potential of the main semiconductor element 111, whereby a parasitic diode is formed by pn junctions between the $p^+$-type region 162b' and the p-type base region 134b' of the main non-operating region 101b and the $n^-$-type drift region. The p-type base region 134b' of the sensing non-operating region 112b expands spanning substantially an entire region of the main non-operating region 101b, excluding the sensing effective region 112a and therefore, as the surface area of the main non-operating region 101b increases, the operating region of the parasitic diode formed by the p-type base region 134b' of the main non-operating region 101b increases.

When the conventional semiconductor device 120 is equipped having a switching configuration in a circuit device, the parasitic diode formed by the p-type base region 134b' of the main non-operating region 101b turns OFF together with a parasitic diode formed by a pn junction between the p-type base region 134a of the main semiconductor element 111 and the $n^-$-type drift region 132, when the main semiconductor element 111 switches from OFF to ON. Here, positive holes (holes) generated by the main non-operating region 101b flow into the sensing effective region 112a and hole current (reverse recovery current) concentrates in the current sensing portion 112. Therefore, as the surface area of the main non-operating region 101b increases, large current flows to and concentrates in the current sensing portion 112, whereby the current sensing portion 112 become susceptible to destruction.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to a first embodiment is configured using a semiconductor (wide bandgap material) having a bandgap wider than that of silicon (Si) as a semiconductor material. A structure of the semiconductor device according to the first embodiment will be described taking, as an example, a case in which, for example, silicon carbide (SiC) is used as a wide bandgap material. FIG. 1 is a plan view of a layout when the semiconductor device according to the first embodiment is viewed from a front side of a semiconductor substrate. In FIG. 1, a p-type base region (second second-conductivity-type region) 34b of a sensing effective region (second effective region) 12a, a p-type base region (third second-conductivity-type region) 34b' of a sensing non-operating region (non-operating region) 12b, and a p-type base region (fourth second-conductivity-type region) 34c of a main non-operating region 1b are depicted in mutually different hatching (similarly in FIG. 11).

A semiconductor device 20 according to the first embodiment and depicted in FIG. 1 has a main semiconductor element (first insulated gate field effect transistor) 11 and one or more circuit portions for protecting/controlling the main semiconductor element 11, in an active region 1 of a single semiconductor substrate (semiconductor chip) 10. The main semiconductor element 11 is a vertical MOSFET in which in an ON state, drift current flows in a depth direction Z of a semiconductor substrate 10. The main semiconductor element 11 is configured by plural unit cells (functional units of the element) connected in parallel by a source pad (first source pad) 21a.

The unit cells of the main semiconductor element 11 are disposed adjacent to each other in a direction parallel to a front surface of the semiconductor substrate 10. The main semiconductor element 11 performs a main operation of the semiconductor device 20 according to the first embodiment. The main semiconductor element 11 is disposed in an effective region (main effective region: first effective region) 1a of the active region 1. The main effective region 1a is a region through which a main current of the main semiconductor element 11 flows when the main semiconductor element 11 is ON. The main effective region 1a, for example, has a substantially rectangular planar shape and occupies most of the surface area of the active region 1.

The circuit portions for protecting/controlling the main semiconductor element 11, for example, are high-function portions such as a current sensing portion (second insulated gate field effect transistor) 12, a temperature sensing portion 13, an over-voltage protecting portion (not depicted), and an arithmetic circuit portion (not depicted), and are disposed in the main non-operating region 1b of the active region 1. The main non-operating region 1b is a region in which no unit cells of the main semiconductor element 11 are disposed and does not function as the main semiconductor element 11. The main non-operating region 1b, for example, has a substantially rectangular planar shape, and is disposed between the main effective region 1a and an edge termination region 2.

The edge termination region 2 is a region between the active region 1 and an edge of the semiconductor substrate 10, surrounds a periphery of the active region 1, mitigates electric field on the front side of the semiconductor substrate 10, and sustains a breakdown voltage. In the edge termination region 2, for example, a voltage withstanding structure (not depicted) such as a field limiting ring (FLR), a junction termination extension (JTE) structure, etc. is disposed. The breakdown voltage is a voltage limit at which no errant operation or destruction of the element occurs.

The source pad (electrode pad) 21a of the main semiconductor element 11 is disposed on the front surface of the semiconductor substrate 10, in the main effective region 1a. The main semiconductor element 11 has a greater current capacity as compared to other circuit portions. Therefore, the source pad 21a of the main semiconductor element 11 has a planar shape substantially like that of the main effective region 1a and covers substantially the main effective region 1a entirely. The source pad 21a of the main semiconductor element 11 is disposed separated from electrode pads other than the source pad 21a.

The electrode pads other than the source pad 21a are disposed separated from the edge termination region 2 and separated from each other, on the front surface of the semiconductor substrate 10 in the main non-operating region 1b. The electrode pads other than the source pad 21a are the gate pad 21b of the main semiconductor element 11, an electrode pad (hereinafter, OC pad (second source pad)) 22 of the current sensing portion 12, electrode pads (hereinafter, anode pad and cathode pad) 23a, 23b of the temperature sensing portion 13, an electrode pad (hereinafter, OV pad (not depicted)) of the over-voltage protecting portion, and an electrode pad (not depicted) of the arithmetic circuit portion.

The electrode pads other than the source pad 21a, for example, have a substantially rectangular planar shape and a surface area necessary for bonding terminal pins 48b to 48d described hereinafter, wiring, etc. FIG. 1 depicts a case in which the electrode pads other than the source pad 21a are disposed in a row along a border between the main non-operating region 1b and the edge termination region 2 (similarly in FIG. 11). Further, in FIG. 1, the source pad 21a, the gate pad 21b, the OC pad 22, the anode pad 23a, and the cathode pad 23b are depicted in rectangular shapes indicated by S, G, OC, A, and K, respectively (similarly in FIG. 11).

The current sensing portion 12 operates under conditions similar to those of the main semiconductor element 11 and has a function of detecting overcurrent (OC) flowing in the main semiconductor element 11. The current sensing portion 12 is disposed separated from the main semiconductor element 11. The current sensing portion 12 is a vertical MOSFET that includes unit cells having a configuration similar to those of the main semiconductor element 11, of a quantity (for example, about 10) lower than a quantity (for example, about 10,000) of the unit cells of the main semiconductor element 11, and that has a surface area smaller than a surface area of the main semiconductor element 11.

The unit cells of the current sensing portion 12 are disposed in a region (hereinafter, sensing effective region) 12a of a portion directly beneath the OC pad 22. The sensing effective region 12a, for example, has a rectangular planar shape. Unit cells of the current sensing portion 12 are disposed adjacent to each other along a direction parallel to the front surface of the semiconductor substrate 10. The direction along which the unit cells of the current sensing portion 12 are adjacent to each other, for example, is a same direction along which the unit cells of the main semiconductor element 11 are adjacent to each other. The unit cells of the current sensing portion 12 are connected in parallel to each other by the OC pad 22.

Further, directly beneath the OC pad 22, a region excluding the sensing effective region 12a is a sensing non-operating region 12b that does not function as the current sensing portion 12. In the sensing non-operating region 12b, no unit cells of the current sensing portion 12 are disposed. In substantially the entire sensing non-operating region 12b, the p-type base region 34b' is provided in a surface region of the front surface of the semiconductor substrate 10. The p-type base region 34b', for example, surrounds a periphery of the sensing effective region 12a in a substantially rectangular shape. The p-type base region 34b' has a function of making the electric field at the front surface of the semiconductor substrate 10 uniform in the sensing non-operating region 12b to, thereby, enhance the breakdown voltage.

The p-type base region 34b', by an n⁻-type region 32a, is separated from a p-type base region (first second-conductivity-type region) 34a of the main semiconductor element 11 and, a p-type region (not depicted) for element isolation and the p-type base region 34c described hereinafter of the main non-operating region 1b. The p-type base region 34b', by an n⁻-type region (second first-conductivity-type region) 32b, is separated from the p-type base region 34b of the sensing effective region 12a. The p-type region for element isolation is a floating p-type region that is disposed in the edge termination region 2, in a substantially rectangular shape surrounding a periphery of the active region 1, and that forms by a pn junction with an n⁻-type drift region (first first-conductivity-type region) 32, a parasitic diode that electrically separates the active region 1 and the edge termination region 2.

The p-type base region 34b' is adjacent to and separated from the p-type base region 34b of the sensing effective region 12a by a surface area larger than a surface area of the sensing effective region 12a. In particular, between the p-type base region 34b' of the sensing non-operating region 12b and the p-type base region 34b of the sensing effective region 12a, the n⁻-type region 32b that surrounds a periphery of the sensing effective region 12a in a substantially rectangular shape is disposed. The n⁻-type region 32b has a surface area larger than that of the sensing effective region 12a. A distance w1 between the p-type base region 34b' of the sensing non-operating region 12b and the p-type base region 34b of the sensing effective region 12a, for example, is at least 0.1 μm and may be as short as possible.

A reason that the distance w1 between the p-type base region 34b' of the sensing non-operating region 12b and the p-type base region 34b of the sensing effective region 12a may be as short as possible is as follows. As the distance w1 between the p-type base region 34b' of the sensing non-operating region 12b and the p-type base region 34b of the sensing effective region 12a increases, a surface area of the n⁻-type region 32b disposed between the p-type base regions 34b', 34b increases. Electric field locally concentrates at a field insulating film in a portion covering the n⁻-type region 32b, reducing the breakdown voltage and therefore, by making the distance w1 as short as possible and the surface area of the n⁻-type region 32b as small as possible, decreases in the breakdown voltage in the sensing non-operating region 12b may be prevented.

The p-type base region 34b' floats (has a floating potential) without being set to an electric potential (source potential) common to the main semiconductor element 11. By making the p-type base region 34b' floating, when a parasitic diode 17 (refer to FIG. 4) of the current sensing portion 12 turns OFF, excess flow of positive hole (hole) current generated at the main effective region 1a to the p-type base region 34b of the sensing effective region 12a may be prevented. Therefore, electric field applied to the current sensing portion 12 may be mitigated, thereby enabling reverse recovery capability of the parasitic diode of the main non-operating region 1b to be increased.

In a region (region excluding the current sensing portion 12: non-operating region) of the main non-operating region 1b excluding that directly beneath the OC pad 22, the p-type base region 34c may be provided in a surface region of the front surface of the semiconductor substrate 10. The p-type base region 34c of the main non-operating region 1b is connected to the p-type base region 34a of the main semiconductor element 11 and fixed at the source potential of the main semiconductor element 11. The larger is a surface area of the p-type base region 34c, the higher forward voltage of the parasitic diode 17 (refer to FIG. 4) formed in the main non-operating region 1b may be set. FIG. 1 depicts a case in which the p-type base region 34c is provided in substantially the entire main non-operating region 1b excluding a region directly beneath the OC pad 22.

The p-type base region 34c and a second p⁺-type region 62c described hereinafter of the main non-operating region 1b are disposed separated from the p-type region for element isolation. The p-type base regions 34b', 34c, a second p⁺-type region 62b' described hereinafter, and the second p⁺-type region 62c of the main non-operating region 1b are disposed separated from the p-type region for element isolation, whereby when the parasitic diode 17 formed in the main non-operating region 1b turns OFF, the positive holes that are generated in the n⁻-type drift region 32 of the edge termination region 2 and flow to the main non-operating region 1b from a back side of the semiconductor substrate 10 in the p-type region for element isolation may be prevented from concentrating in the current sensing portion 12.

The temperature sensing portion 13 has a function of detecting a temperature of the main semiconductor element 11 by using diode temperature characteristics. The temperature sensing portion 13 is disposed directly beneath the anode pad 23a and the cathode pad 23b. The temperature sensing portion 13, for example, may be configured by a polysilicon (poly-Si) layer provided on a field insulating film (in the first embodiment, a field insulating film part 80c) on the front surface of the semiconductor substrate 10, or may be formed by a pn junction between a p-type region and an n-type region formed in the semiconductor substrate 10.

The over-voltage protecting portion (not depicted), for example, is a diode that protects the main semiconductor element 11 from overvoltage (OV) such as surges. The current sensing portion 12, the temperature sensing portion 13, and the over-voltage protecting portion are controlled by the arithmetic circuit portion. The main semiconductor element 11 is controlled based on output signals from the current sensing portion 12, the temperature sensing portion 13, and the over-voltage protecting portion. The arithmetic circuit portion is configured by plural semiconductor elements such as complementary MOS (CMOS) circuits.

Figure 2:
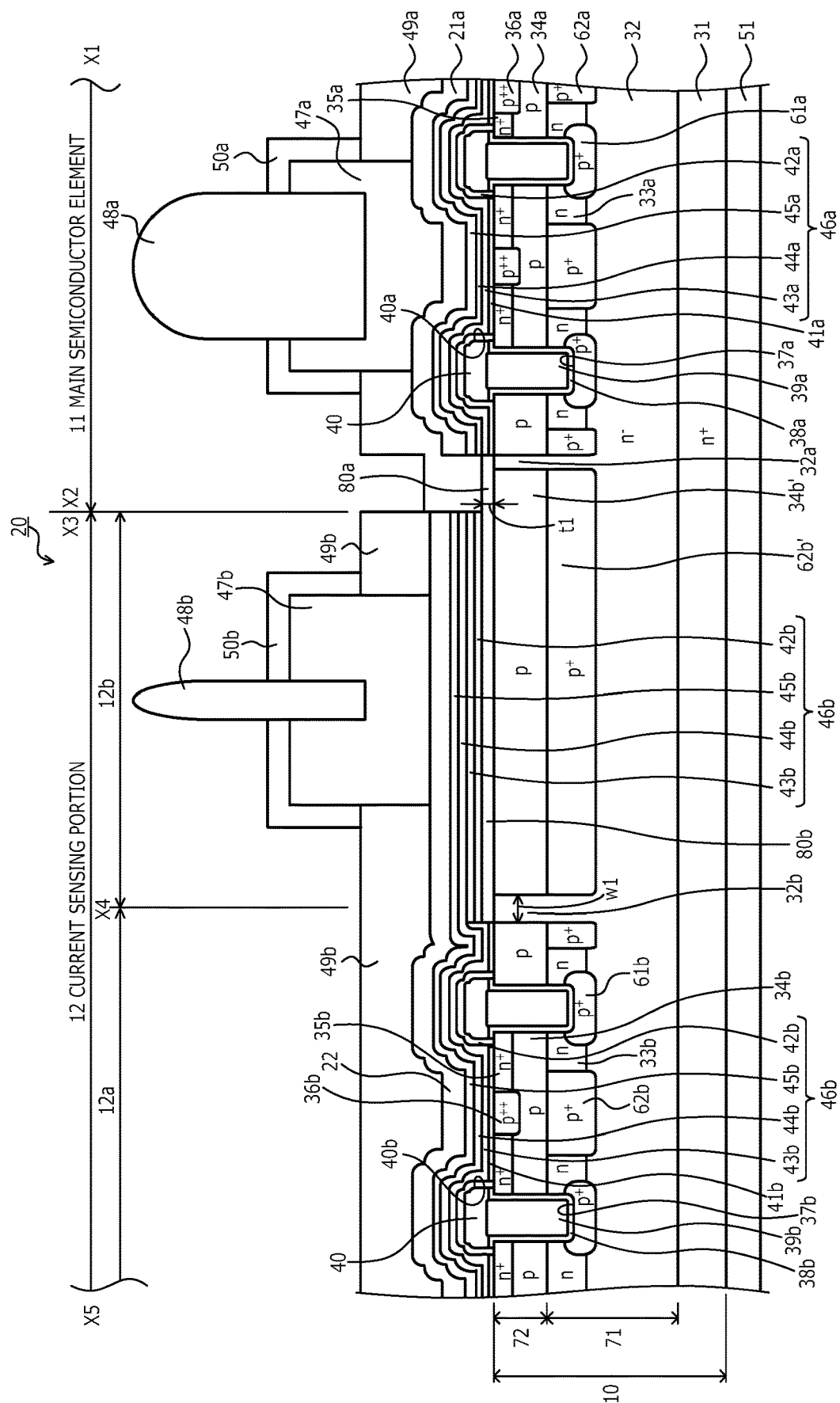
FIG. 2 is a cross-sectional view of a structure of an active region in FIG. 1.
Figure 3:
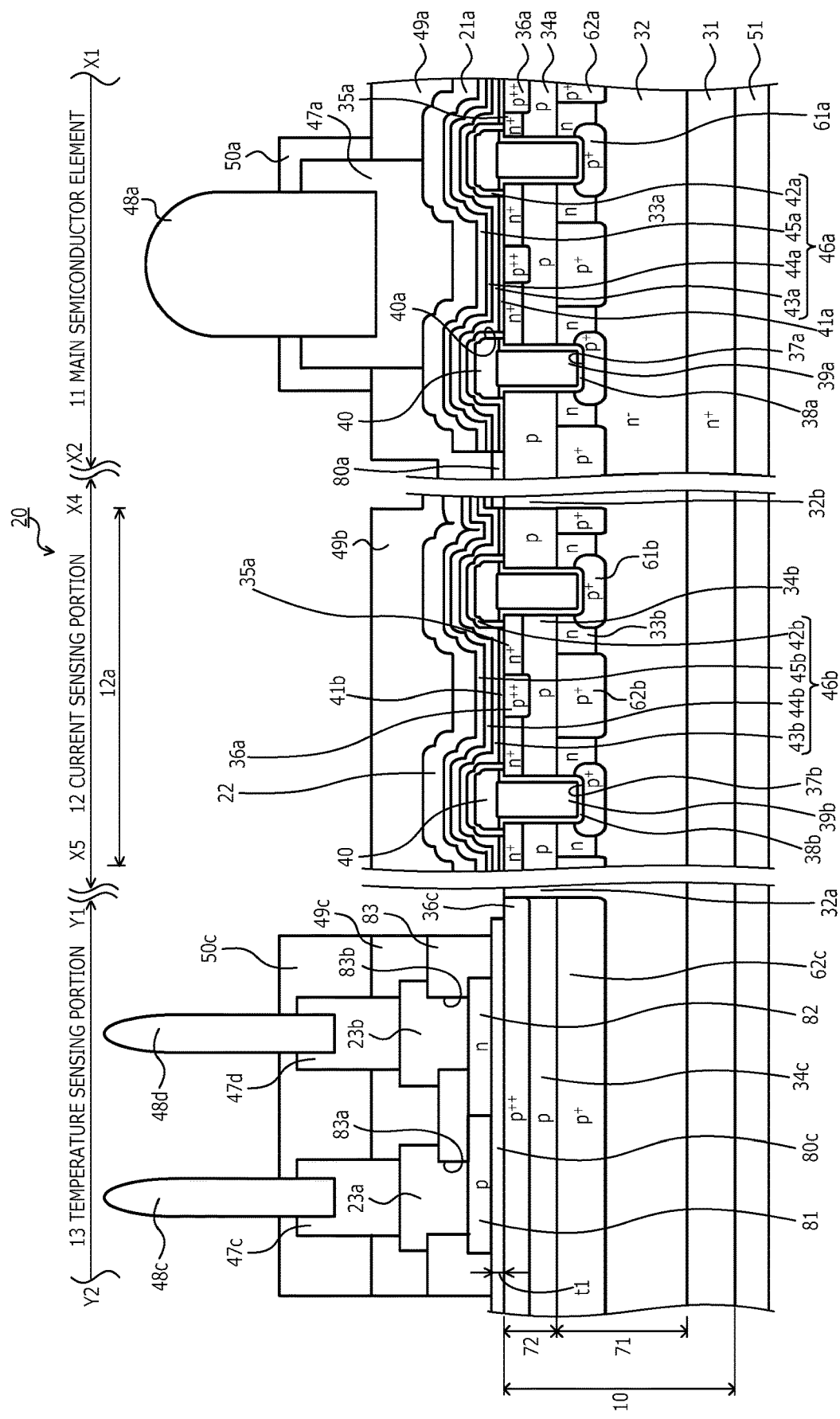
FIG. 3 is a cross-sectional view of the structure of the active region in FIG. 1.

A cross-section of a structure of the active region 1 of the semiconductor device 20 according to the first embodiment will be described. FIGS. 2 and 3 are cross-sectional views of the structure of the active region in FIG. 1. FIG. 2 depicts a cross-section (along cutting line X1-X2-X3-X4-X5) of the structure of the main effective region 1a and the current sensing portion 12. FIG. 3 depicts a cross-section (along cutting line X1-X2, cutting line X4-X5, and cutting line Y1-Y2) of the structure of the main effective region 1a, the sensing effective region 12a, and the temperature sensing portion 13.

In FIGS. 2 and 3, while only a portion of the unit cells of the main effective region 1a and the sensing effective region 12a is depicted, unit cells of the main effective region 1a and the sensing effective region 12a all have a similar structure. Further, in FIGS. 2 and 3, while a cross-section of the structure directly beneath the gate pad 21b is not depicted, a cross-section of the structure directly beneath the gate pad 21b is similar to that directly beneath the anode pad 23a and the cathode pad 23b. In FIG. 3, the sensing non-operating region 12b between the main effective region 1a and the sensing effective region 12a is not depicted.

The main semiconductor element 11 is a vertical MOSFET that includes a MOS gate (insulated gate formed by a 3-layer structure including a metal, an oxide film, and a semiconductor) on the front side of the semiconductor substrate 10, in the main effective region 1a. Here, while a case in which the main semiconductor element 11 and the circuit portions that protect and control the main semiconductor element 11 have wiring structures of a similar configuration that uses pin-shaped wiring members (terminal pins 48a to 48d described hereinafter) is described as an example, instead of the pin-shaped wiring members, each may have a wiring structure that uses wires.

The semiconductor substrate 10 is an epitaxial substrate in which silicon carbide layers 71, 72 that become the n$^-$-type drift region 32 and the p-type base region 34a are sequentially formed by epitaxial growth on an n$^+$-type starting substrate 31 containing silicon carbide. The main semiconductor element 11 has general MOS gates configured by the p-type base region 34a, n$^+$-type source regions 35a, p$^{++}$-type contact regions 36a, trenches 37a, a gate insulating film 38a, and gate electrodes 39a provided on the front side of the semiconductor substrate 10.

The trenches 37a penetrate through the p-type silicon carbide layer 72 in the depth direction Z from the front surface of the semiconductor substrate 10 (surface of p-type silicon carbide layer 72) and reach the n$^-$-type silicon carbide layer 71. The trenches 37a, for example, may be disposed in a striped shape extending along a direction parallel to the front surface of the semiconductor substrate 10 or may be disposed in a matrix-like layout when viewed from the front side of the semiconductor substrate 10. FIGS. 2 and 3 depict the trenches 37a having a striped shape extending in a first direction X (refer to FIG. 1) along which the electrode pads 21b, 23a, 23b, 22 are arranged. Reference character Y is a direction that is parallel to the front surface of the semiconductor chip and orthogonal to the first direction.

In the trenches 37a, the gate electrodes 39a are provided via the gate insulating film 38a. The p-type base region 34a, the n$^+$-type source region 35a, and the p$^{++}$-type contact region 36a are selectively provided in a surface region of the front surface of the semiconductor substrate 10 between (mesa region) two of the trenches 37a that are adjacent to each other. The n$^+$-type source region 35a and the p$^{++}$-type contact region 36a are provided between the front surface of the semiconductor substrate 10 and the p-type base region 34a.

The n$^+$-type source region 35a is provided closer to the trenches 37a than is the p$^{++}$-type contact region 36a. The p$^{++}$-type contact region 36a may be omitted. When the p$^{++}$-type contact region 36a is not provided, at a part separated further from the trenches 37a than is the n$^+$-type source region 35a, the p-type base region 34a reaches the front surface of the semiconductor substrate 10 and is exposed at the front surface of the semiconductor substrate 10.

In the semiconductor substrate 10, at a position closer to an n$^+$-type drain region (the n$^+$-type starting substrate 31) than is the p-type base region 34a, the type drift region 32 is provided in contact with the p-type base region 34a. In contact with these regions, an n-type current spreading region 33a may be provided between the p-type base region 34a and the n$^-$-type drift region 32. The n-type current spreading region 33a is a so-called current spreading layer (CSL) that reduces carrier spreading resistance.

Further, in the semiconductor substrate 10, first and second p$^+$-type regions 61a, 62a may be provided at positions closer to the n$^+$-type drain region than is the p-type base region 34a. The first p$^+$-type regions 61a are provided separated from the p-type base region 34a and oppose bottoms of the trenches 37a in the depth direction Z. The second p$^+$-type regions 62a are provided in the mesa regions, are separated from the first p$^+$-type regions 61a and the trenches 37a, and reach the p-type base region 34a. The first and the second p$^+$-type regions 61a, 62a have a function of mitigating electric field applied to the bottoms of the trenches 37a.

An interlayer insulating film 40 is provided on the entire front surface of the semiconductor substrate 10 and covers the gate electrodes 39a. All of the gate electrodes 39a of the main semiconductor element 11 are electrically connected to the gate pad 21b (refer to FIG. 1) via a gate runner (not depicted), at a portion not depicted. The gate runner is a gate polysilicon layer that is provided on the front surface of the semiconductor substrate in the edge termination region 2 via a field insulating film and that surrounds a periphery of the active region 1 in a substantially rectangular shape.

In first contact holes 40a that penetrate through the interlayer insulating film 40 in the depth direction Z and reach the semiconductor substrate 10, the n$^+$-type source regions 35a and the p$^{++}$-type contact regions 36a of the main semiconductor element 11 are exposed. In the first contact holes 40a, on the front surface of the semiconductor substrate 10, nickel silicide (NiSi, Ni$_2$Si, or thermally stable NiSi$_2$, hereinafter, collectively "NiSi") films 41a are provided.

The NiSi films 41a, in the first contact holes 40a, are in ohmic contact with the semiconductor substrate 10 and are electrically connected to the n$^+$-type source regions 35a and the p$^{++}$-type contact regions 36a. In a case where the p$^{++}$-type contact regions 36a are not provided, instead of the p$^{++}$-type contact regions 36a, the p-type base region 34a is exposed by the first contact holes 40a and is electrically connected to the NiSi films 41a.

In the main effective region 1a, on surfaces of the interlayer insulating film 40 and the NiSi films 41a overall, a barrier metal 46a is provided. The barrier metal 46a has a function of preventing interaction between metal films of the barrier metal 46a or between regions opposing and sandwiching the barrier metal 46a. The barrier metal 46a, for example, may have a stacked structure in which a first titanium nitride (TiN) film 42a, a first titanium (Ti) film 43a, a second TiN film 44a, and a second Ti film 45a are sequentially stacked.

The first TiN film 42a is provided only on a surface of the interlayer insulating film 40, covering the surface of the interlayer insulating film 40 overall. The first Ti film 43a is provided on surfaces of the first TiN film 42a and the NiSi films 41a. The second TiN film 44a is provided on a surface of the first Ti film 43a. The second Ti film 45a is provided on a surface of the second TiN film 44a. The barrier metal 46a, for example, is not provided in the temperature sensing portion 13.

The source pad 21a is embedded in the first contact holes 40a and provided on the entire surface of the second Ti film 45a. The source pad 21a is electrically connected to the $n^+$-type source regions 35a and the p-type base region 34a via the barrier metal 46a and the NiSi films 41a and functions as a source electrode of the main semiconductor element 11. The source pad 21a, for example, is an aluminum (Al) film or an aluminum alloy film having a thickness of about 5 μm.

In particular, when the source pad 21a is an aluminum alloy film, the source pad 21a, for example, may be an aluminum-silicon (Al—Si) film that contains at most about 5% in total, may be an aluminum-silicon-copper (Al—Si—Cu) film that contains at most about 5% silicon and at most about 5% copper (Cu) in total, or may be an aluminum-copper (Al—Cu) film that contains at most about 5% copper in total.

First ends of the terminal pins 48a are bonded on the source pad 21a, via plating films 47a and solder layers (not depicted). Second ends of the terminal pins 48a are bonded to a metal bar (not depicted) disposed so as to oppose the front surface of the semiconductor substrate 10. Further, the second ends of the terminal pins 48a are exposed outside a case (not depicted) in which the semiconductor substrate 10 is mounted and are electrically connected to an external device (not depicted). The terminal pins 48a are wiring members having a round bar-like (cylindrical) shape of a predetermined diameter.

The terminal pins 48a are soldered to the plating films 47a in a substantially upright state with respect to the front surface of the semiconductor substrate 10. The terminal pins 48a are external connection terminals that lead out electric potential of the source pad 21a to an external destination and are connected to an external ground potential (minimum electric potential). A portion of the surface of the source pad 21a other than portions having the plating films 47a is covered by a first protective film 49a, and borders between the plating films 47a and the first protective film 49a are covered by second protective films 50a. The first and the second protective films 49a, 50a, for example, are polyimide films.

A drain electrode 51 is in ohmic contact with an entire back surface (back surface of the $n^+$-type starting substrate 31) of the semiconductor substrate 10. On the drain electrode 51, for example, a drain pad (electrode pad: not depicted) is provided having a stacked structure in which a Ti film, a nickel (Ni) film, and a gold (Au) film are sequentially stacked. The drain pad is soldered to a metal base plate (not depicted) and via the metal base plate, at least a portion thereof is in contact with a base part of a cooling fin (not depicted).

In this manner, the terminal pins 48a are bonded to the front surface of the semiconductor substrate 10 and the back surface is bonded to the metal base plate, whereby the semiconductor device 20 according to the first embodiment has a double-sided cooling structure in which a cooling structure is provided on both sides of the semiconductor substrate 10. In other words, heat generated by the semiconductor substrate 10 is radiated from a fin portion of the cooling fin in contact with the back surface of the semiconductor substrate 10 via the metal base plate and is radiated from the metal bar to which the terminal pins 48a of the front surface of the semiconductor substrate 10 are bonded.

The current sensing portion 12 includes the p-type base region 34b, $n^+$-type source regions 35b, $p^{++}$-type contact regions 36b, trenches 37b, a gate insulating film 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b of the current sensing portion 12, similarly to the p-type base region 34a of the main semiconductor element 11, is configured by the p-type silicon carbide layer 72.

In the current sensing portion 12 as well, similarly to the main semiconductor element 11, the $p^{++}$-type contact regions 36b may be omitted. The current sensing portion 12, similarly to the main semiconductor element 11, may have an n-type current spreading region 33b and first and second $p^+$-type regions 61b, 62b. The gate electrodes 39b of the current sensing portion 12 are electrically connected to the gate pad 21b (refer to FIG. 1) via the gate runner (not depicted). The gate electrodes 39b of the current sensing portion 12 are covered by the interlayer insulating film 40.

In the sensing effective region 12a, second contact holes 40b that penetrate through the interlayer insulating film 40 in the depth direction Z and reach the semiconductor substrate 10 are provided. In the second contact holes 40b, the $n^+$-type source regions 35b and the $p^{++}$-type contact regions 36b of the current sensing portion 12 are exposed. In the second contact holes 40b, similarly to the main semiconductor element 11, NiSi films 41b that are electrically connected to the $n^+$-type source regions 35b and the $p^{++}$-type contact regions 36b are provided.

In a case where the $p^{++}$-type contact regions 36b are not provided, instead of the $p^{++}$-type contact regions 36b, the p-type base region 34b is exposed by the second contact holes 40b and is electrically connected to the NiSi films 41b. In the sensing effective region 12a, similarly to the main semiconductor element 11, a barrier metal 46b is provided on an entire surface of the interlayer insulating film 40 and entire surfaces of the NiSi films 41b. Reference characters 42b to 45b are a first TiN film, a first Ti film, a second TiN film, and a second Ti film configuring the barrier metal 46b.

The OC pad 22 is provided on the entire surface of the barrier metal 46b so as to be embedded in the second contact holes 40b. The OC pad 22 is electrically connected to the $n^+$-type source regions 35b and the p-type base region 34b of the current sensing portion 12, via the barrier metal 46b and the NiSi films 41b. The OC pad 22 functions as a source electrode of the current sensing portion 12. The OC pad 22, for example, is formed by a material similar to that of the source pad 21a.

In the sensing non-operating region 12b of the main non-operating region 1b, the p-type base region 34b' is provided in a surface region of the front surface of the semiconductor substrate, as described above. The p-type base region 34b', similarly to the p-type base region 34a of the main semiconductor element 11, is configured by the p-type silicon carbide layer 72. The p-type base region 34b' is provided between the p-type base region 34b of the current sensing portion 12 and the p-type base region 34a of the main semiconductor element 11, the p-type base region 34c of the main non-operating region 1b, and the p-type region for element isolation (not depicted).

The p-type base region 34b', as described above, is separated from the p-type base region 34a of the main semiconductor element 11, the p-type base region 34c of the main non-operating region 1b, and the p-type region for element isolation, by the n⁻-type region 32a and is separated from the p-type base region 34b of the current sensing portion 12, by the n⁻-type region 32b. The n⁻-type regions 32a, 32b, for example, are diffusion regions that penetrate through the p-type silicon carbide layer 72 in the depth direction Z and reach the n⁻-type silicon carbide layer 71, and that are provided in a surface region of the front surface of the semiconductor substrate 10. The second p⁺-type region 62b' may be provided between the p-type base region 34b' and the n⁻-type drift region 32, in contact with these regions 34b', 32.

In substantially an entire region of the main non-operating region 1b excluding a portion directly beneath the OC pad 22, as described above, the p-type base region 34c is provided in a surface region of the front surface of the semiconductor substrate 10. The p-type base region 34c, similarly to the p-type base region 34b of the current sensing portion 12, is configured by the p-type silicon carbide layer 72. Between the p-type base region 34c and the front surface of the semiconductor substrate 10, a p⁺⁺-type contact region 36c may be provided. The second p⁺-type region 62c may be provided between the p-type base region 34c and the n⁻-type drift region 32, in contact with these regions 34c, 32.

In a region of the main non-operating region 1b excluding the sensing effective region 12a and in the edge termination region 2, a field insulating film (80a, 80b, 80c) having a uniform thickness is provided on the entire front surface of the semiconductor substrate 10. A thickness t1 of the field insulating film, for example, is in a range from about 0.6 µm to 0.8 µm and, for example, may be about 0.7 µm. In FIGS. 2 and 3, a part of the field insulating film near a border between the main effective region 1a and the main non-operating region 1b is indicated by reference character 80a. Of the field insulating film in the main non-operating region 1b, a part in the sensing non-operating region 12b is indicated by reference character 80b and a part excluding the sensing non-operating region 12b is indicated by reference character 80c.

In the sensing non-operating region 12b, on the field insulating film part 80b, the barrier metal 46b and the OC pad 22 extend from the sensing effective region 12a. In the sensing non-operating region 12b, the terminal pins 48b are bonded on the OC pad 22 by a wiring structure similar to the wiring structure on the source pad 21a. The terminal pins 48b are wiring members having a round bar-like (cylindrical) shape of a diameter smaller than that of the terminal pins 48a.

Figure 4:
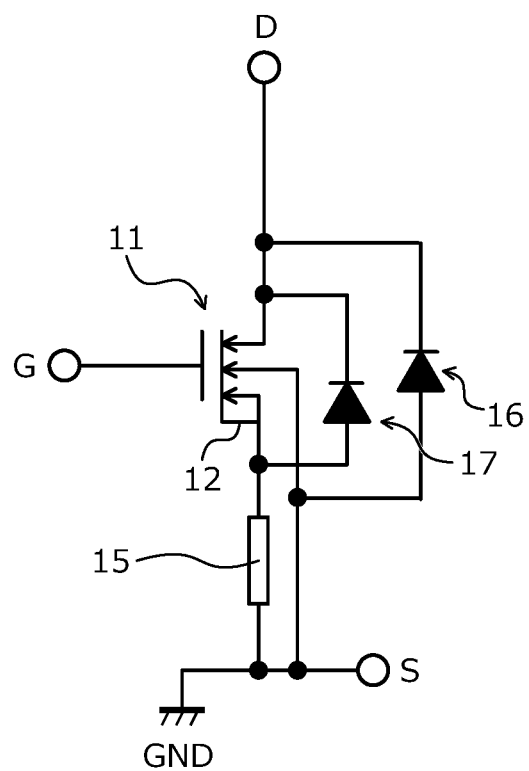
FIG. 4 is a circuit diagram depicting an equivalent circuit of the semiconductor device according to the first embodiment.

The terminal pins 48b, for example, are external connection terminals that lead out electric potential of the OC pad 22 and connect the OC pad 22 to a ground potential via an external resistor 15 (refer to FIG. 4). Disposal of the terminal pins 48b in the sensing non-operating region 12b enables pressure generated during bonding of the terminal pins 48b to be prevented from being applied to unit cells of the current sensing portion 12. Reference characters 47b, 49b, 50b are a plating film and first and second protective films that configure the wiring structure on the OC pad 22.

The temperature sensing portion 13, for example, is a polysilicon diode formed by a pn junction between a p-type polysilicon layer 81 that is a p-type anode region and an n-type polysilicon layer 82 that is an n-type cathode region. The p-type polysilicon layer 81 and the n-type polysilicon layer 82 are provided on the field insulating film part 80c in the main non-operating region 1b. The temperature sensing portion 13 is electrically insulated from the main semiconductor element 11 and the current sensing portion 12, by the field insulating film part 80c.

The field insulating film part 80c, the p-type polysilicon layer 81, and the n-type polysilicon layer 82 are covered by an interlayer insulating film 83. The anode pad 23a and the cathode pad 23b are in contact with the p-type polysilicon layer 81 and the n-type polysilicon layer 82 in third and fourth contact holes 83a, 83b of the interlayer insulating film 83, respectively. A material of the anode pad 23a and the cathode pad 23b, for example, is similar to that of the source pad 21a.

The terminal pins 48c, 48d are bonded on the anode pad 23a and on the cathode pad 23b, respectively, by a wiring structure similar to the wiring structure on the source pad 21a. The terminal pins 48c, 48d are external connection terminals that lead out electric potential of the anode pad 23a and the cathode pad 23b, respectively, to an external destination. The terminal pins 48c, 48d are wiring members having a round bar-like shape of a predetermined diameter.

Reference characters 47c, 47d are plating films respectively configuring the wiring structure on the anode pad 23a and the wiring structure on the cathode pad 23b. Reference characters 49c, 50c are respectively first and second protective films configuring the wiring structures on the temperature sensing portion 13. In a surface region of the front surface of the semiconductor substrate 10, the p-type base region 34c, the p⁺⁺-type contact region 36c, and the second p⁺-type region 62c of the main non-operating region 1b and described above extend directly beneath the temperature sensing portion 13.

While not depicted, the gate pad 21b is provided on the field insulating film part 80c. A barrier metal having a stacked structure similar to that of the barrier metal 46a may be provided between the gate pad 21b and the field insulating film part 80c. A material of the gate pad 21b, for example, is similar to that of the source pad 21a. On the gate pad 21b as well, for example, terminal pins are bonded by a wiring structure (not depicted) similar to the wiring structure on the source pad 21a.

In a surface region of the front surface of the semiconductor substrate 10, the p-type base region 34c, the p⁺⁺-type contact region 36c, and the second p⁺-type region 62c also extend directly beneath a gate pad portion 14, similarly to directly beneath the anode pad 23a and the cathode pad 23b. In other words, in the depth direction Z, the p-type base region 34c, the p⁺⁺-type contact region 36c, and the second p⁺-type region 62c oppose surfaces of all the electrode pads of the main non-operating region 1b other than the OC pad 22.

The p-type base region 34c, the p⁺⁺-type contact region 36c, and the second p⁺-type region 62c, for example, have depths and impurity concentrations equal to those of the p-type base region 34a, the p⁺⁺-type contact regions 36a, and the second p⁺-type regions 62a of the main semiconductor element 11, respectively.

Operation of the semiconductor device 20 according to the first embodiment will be described. FIG. 4 is a circuit diagram depicting an equivalent circuit of the semiconductor device according to the first embodiment. As depicted in FIG. 4, the current sensing portion 12 is connected in parallel to plural MOSFET unit cells configuring the main semiconductor element 11. A ratio (hereinafter, current sensing ratio) of a sensing current flowing in the current sensing portion 12 and the main current flowing in the main semiconductor element 11 is preset.

The current sensing ratio, for example, may be set by changing the quantity of unit cells in the main semiconductor element 11 and in the current sensing portion 12. A sensing current that is smaller than the main current that flows in the main semiconductor element 11 flows in the current sensing portion 12, corresponding to the current sensing ratio. A source of the main semiconductor element 11 is connected to a grounding point GND of the ground potential. The resistor 15, which is an external component, is connected between the grounding point GND and a source of the current sensing portion 12.

In a state where voltage that is positive with respect to the source electrode of the main semiconductor element 11 (the source pad 21a) is applied to the drain electrode 51, when voltage that is at least equal to a threshold voltage is applied to the gate electrodes 39a of the main semiconductor element 11, an n-type inverse layer (channel) is formed in a portion of the p-type base region 34a of the main semiconductor element 11 sandwiched between the $n^+$-type source regions 35a and the n-type current spreading region 33a. As a result, the main current flows from the drain of the main semiconductor element 11 toward the source thereof and the main semiconductor element 11 turns ON.

Here, in a state in which voltage that is positive with respect to the source electrode (the OC pad 22) of the current sensing portion 12 is applied to the drain electrode 51 under conditions similar to those of the main semiconductor element 11, when voltage at least equal to the threshold voltage is applied to the gate electrodes 39b of the current sensing portion 12, an n-type inverse layer is formed in a portion of the p-type base region 34b of the sensing effective region 12a, the portion sandwiched between the $n^+$-type source regions 35b and the n-type current spreading region 33b. As a result, sensing current from the drain of the current sensing portion 12 toward the source thereof flows and the current sensing portion 12 turns ON.

The sensing current passes through the resistor 15 connected to the source of the current sensing portion 12 and flows to the grounding point GND. As a result, a voltage decrease occurs at the resistor 15. When overcurrent is applied to the main semiconductor element 11, the sensing current of the current sensing portion 12 increases according to the magnitude of the overcurrent to the main semiconductor element 11 and the voltage decrease at the resistor 15 also increases. The magnitude of the voltage decrease at the resistor 15 is monitored, thereby enabling detection of the overcurrent in the main semiconductor element 11.

On the other hand, when voltage less than the threshold voltage is applied to the gate electrodes 39a of the main semiconductor element 11, pn junctions between the first and the second $p^+$-type regions 61a, 62a, the n-type current spreading region 33a, and the $n^-$-type drift region 32 of the main semiconductor element 11 are reverse biased. The voltage that is less than the threshold voltage is further applied to the gate electrodes 39b of the current sensing portion 12 and pn junctions between the first and the second $p^+$-type regions 61b, 62b, the n-type current spreading region 33b, and the $n^-$-type drift region 32 of the current sensing portion 12 are also reverse biased. As a result, the main current of the main semiconductor element 11 and the sensing current of the current sensing portion 12 are blocked; and the main semiconductor element 11 and the current sensing portion 12 maintain the OFF state.

During the OFF state of the main semiconductor element 11, when current that is negative with respect to the source electrode of the main semiconductor element 11 is applied to the drain electrode 51, a parasitic diode 16 formed by pn junctions between the p-type base region 34a, the first and the second $p^+$-type regions 61a, 62a, the n-type current spreading region 33a, and the $n^-$-type drift region 32 of the main effective region 1a of the active region 1 conducts.

Further, the parasitic diode 16 formed by pn junctions between the p-type base region 34c, the second $p^+$-type regions 62a, and the $n^-$-type drift region 32 of the main non-operating region 1b of the active region 1 conducts.

During the OFF state of the current sensing portion 12 as well, voltage that is negative with respect to the source electrode of the current sensing portion 12 is applied to the drain electrode 51 and the parasitic diode 17 formed by pn junctions between the p-type base region 34b, the first and the second $p^+$-type regions 61b, 62b, the n-type current spreading region 33b, and the $n^-$-type drift region 32 of the sensing effective region 12a of the main non-operating region 1b of the active region 1 conducts. A parasitic diode formed by a pn junction between the p-type region for element isolation of the edge termination region 2 and the $n^-$-type drift region 32 conducts.

On the other hand, the p-type base region 34b' that floats is not provided in the sensing non-operating region 12b of the main non-operating region 1b and therefore, no parasitic diode is formed. This region of the main non-operating region 1b in which no parasitic diode is formed is disposed so as to surround a periphery of the sensing effective region 12a. Therefore, the region in which no parasitic diode is formed is present between the parasitic diode 16 of the main semiconductor element 11 and the parasitic diode 17 of the current sensing portion 12.

Thus, when the main semiconductor element 11 and the current sensing portion 12 switch from OFF to ON and the parasitic diodes turn OFF, hole current (reverse recovery current of the parasitic diode 16 of the main semiconductor element 11) generated in the $n^-$-type drift region 32 of the main effective region 1a does not easily flow into the p-type base region 34b of the current sensing portion 12 due to the floating p-type base region 34b' of the sensing non-operating region 12b, passes through the p-type base region 34a of the main semiconductor element 11 and out to the source pad 21a.

The hole current that passes through the p-type base region 34b of the current sensing portion 12 and out to the OC pad 22 may be set to be, substantially, only the hole current (reverse recovery current of the parasitic diode 17 of the current sensing portion 12) generated in the $n^-$-type drift region 32 near the sensing effective region 12a. As a result, the hole current generated by the main effective region 1a may be prevented from flowing excessively to the p-type base region 34b of the sensing effective region 12a. As a result, electric field applied to the current sensing portion 12 may be mitigated and therefore, ESD capability of the current sensing portion 12 increases, enabling the reverse recovery capability of the parasitic diode of the main non-operating region 1b to be increased.

A method of manufacturing the semiconductor device 20 according to the first embodiment will be described. FIGS. 5, 6, 7, 8, 9, and 10 are cross-sectional views of the semiconductor device according to the first embodiment during manufacture. In FIGS. 5 to 10, while only the main semiconductor element 11 is depicted, each part of all elements fabricated (manufactured) on the semiconductor substrate 10 having the main semiconductor element 11, for example, are formed concurrently with each part of the main semiconductor element 11. Formation of each part of the current sensing portion 12, the temperature sensing portion 13, and the gate pad portion 14 will be described with reference to FIGS. 1 to 3.

Figure 5:
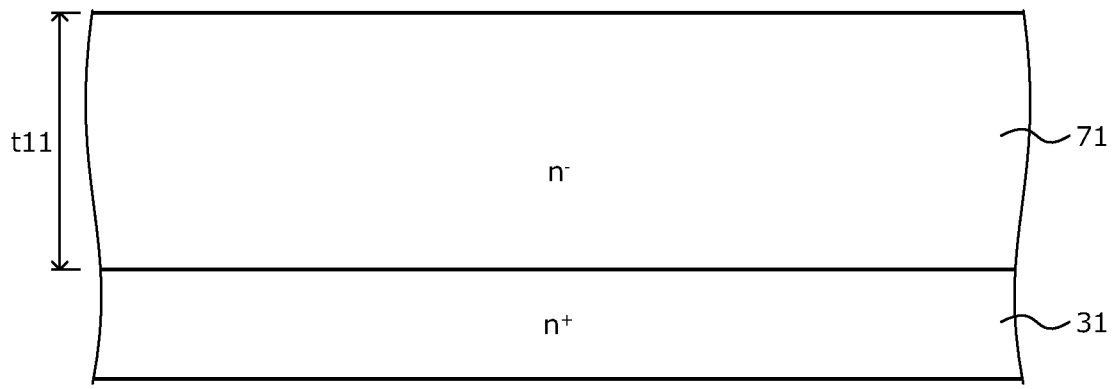
FIG. 5 is a cross-sectional view of the semiconductor device according to the first embodiment during manufacture.

First, as depicted in FIG. 5, the $n^+$-type starting substrate (semiconductor wafer) 31 containing silicon carbide is prepared. The $n^+$-type starting substrate 31, for example, may be a silicon carbide single crystal substrate doped with nitrogen (N). Next, on a front surface of the $n^+$-type starting substrate 31, the $n^-$-type silicon carbide layer 71 doped with a lower concentration of nitrogen than is the $n^+$-type starting substrate 31 is formed by epitaxial growth. When the main semiconductor element 11 has a breakdown voltage of 3300V, a thickness t11 of the $n^-$-type silicon carbide layer 71, for example, may be about 30 μm.

Figure 6:
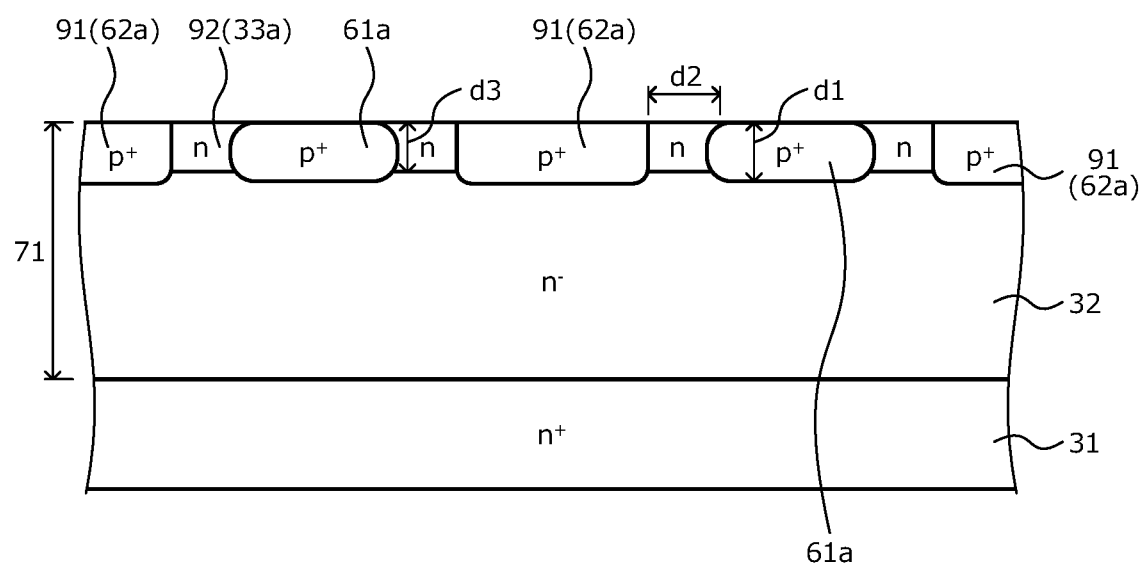
FIG. 6 is a cross-sectional view of the semiconductor device according to the first embodiment during manufacture.

Next, as depicted in FIG. 6, by photolithography and, for example, ion implantation of a p-type impurity such as Al, the first $p^+$-type regions 61a and $p^+$-type regions 91 are selectively formed in a surface region of the $n^-$-type silicon carbide layer 71 in the main effective region 1a. The $p^+$-type regions 91 are a part of the second $p^+$-type regions 62a. The first $p^+$-type regions 61a and the $p^+$-type regions 91, for example, are disposed to repeatedly alternate each other along the first direction X depicted in FIG. 1.

A distance d2 between one of the first $p^+$-type regions 61a and one of the $p^+$-type regions 91 adjacent to each other, for example, may be about 1.5 μm. A depth d1 and an impurity concentration of the first $p^+$-type regions 61a and the $p^+$-type regions 91, for example, may be about 0.5 μm and about $5.0\times10^{18}/cm^3$, respectively. Subsequently, an ion implantation mask (not depicted) used in forming the first $p^+$-type regions 61a and the $p^+$-type regions 91 is removed.

Next, by photolithography and, for example, ion implantation of an n-type impurity such as nitrogen, n-type regions 92 are formed in surface regions of the $n^-$-type silicon carbide layer 71, spanning the main effective region 1a overall. The n-type regions 92, for example, are formed between the first $p^+$-type regions 61a and the $p^+$-type regions 91, to be in contact with these regions. A depth d3 and an impurity concentration of the n-type regions 92, for example, may be about 0.4 μm and about $1.0\times10^{17}/cm^3$, respectively.

The n-type regions 92 are a part of the n-type current spreading region 33a. A portion of the $n^-$-type silicon carbide layer 71 sandwiched between the n-type regions 92, the first $p^+$-type regions 61a, the $p^+$-type regions 91, and the $n^+$-type starting substrate 31 is the $n^-$-type drift region 32. Next, an ion implantation mask (not depicted) used in forming the n-type regions 92 is removed. A sequence in which the n-type regions 92, the first $p^+$-type regions 61a, and the $p^+$-type regions 91 are formed may be interchanged.

Figure 7:
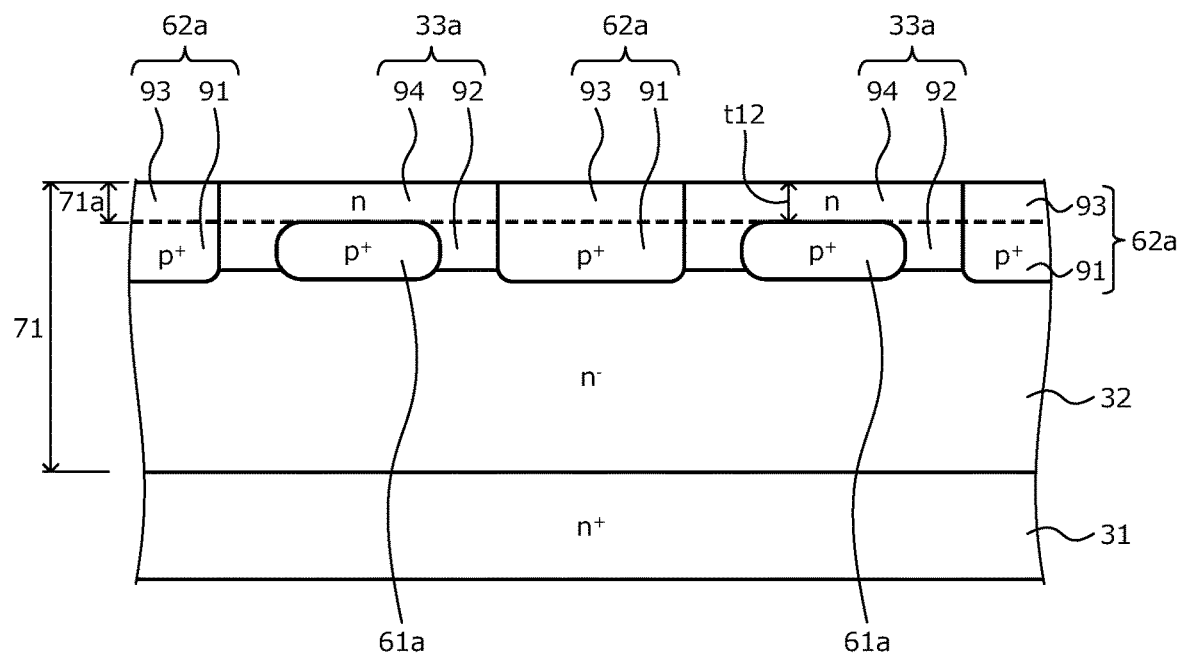
FIG. 7 is a cross-sectional view of the semiconductor device according to the first embodiment during manufacture.

Next, as depicted in FIG. 7, on the $n^-$-type silicon carbide layer 71, for example, an $n^-$-type silicon carbide layer doped with an n-type impurity such as nitrogen is further formed, for example, to have a thickness t12 of 0.5 μm, thereby increasing the thickness of the $n^-$-type silicon carbide layer 71.

Next, by photolithography and ion implantation of a p-type impurity such as Al, in a portion 71a increasing the thickness of the $n^-$-type silicon carbide layer 71, $p^+$-type regions 93 are selectively provided to a depth reaching the $p^+$-type regions 91. The $p^+$-type regions 91, 93 that are adjacent to each other in the depth direction Z are connected and form the second $p^+$-type regions 62a. A width and an impurity concentration of the $p^+$-type regions 93, for example, are substantially equal to those of the $p^+$-type regions 91. Next, an ion implantation mask used in forming the $p^+$-type regions 93 (not depicted) is removed.

Next, by photolithography and, for example, ion implantation of an n-type impurity such as nitrogen, in the portion 71a increasing the thickness of the $n^-$-type silicon carbide layer 71, n-type regions 94 are selectively formed to a depth reaching the n-type regions 92. An impurity concentration of the n-type regions 94, for example, is substantially equal to that of the n-type regions 92. The n-type regions 92, 94 that are adjacent to each other in the depth direction Z are connected, whereby the n-type current spreading region 33a is formed. A sequence in which the $p^+$-type regions 93 and the n-type regions 94 are formed may be interchanged. Next, an ion implantation mask (not depicted) used in forming the n-type regions 94 is removed.

Figure 8:
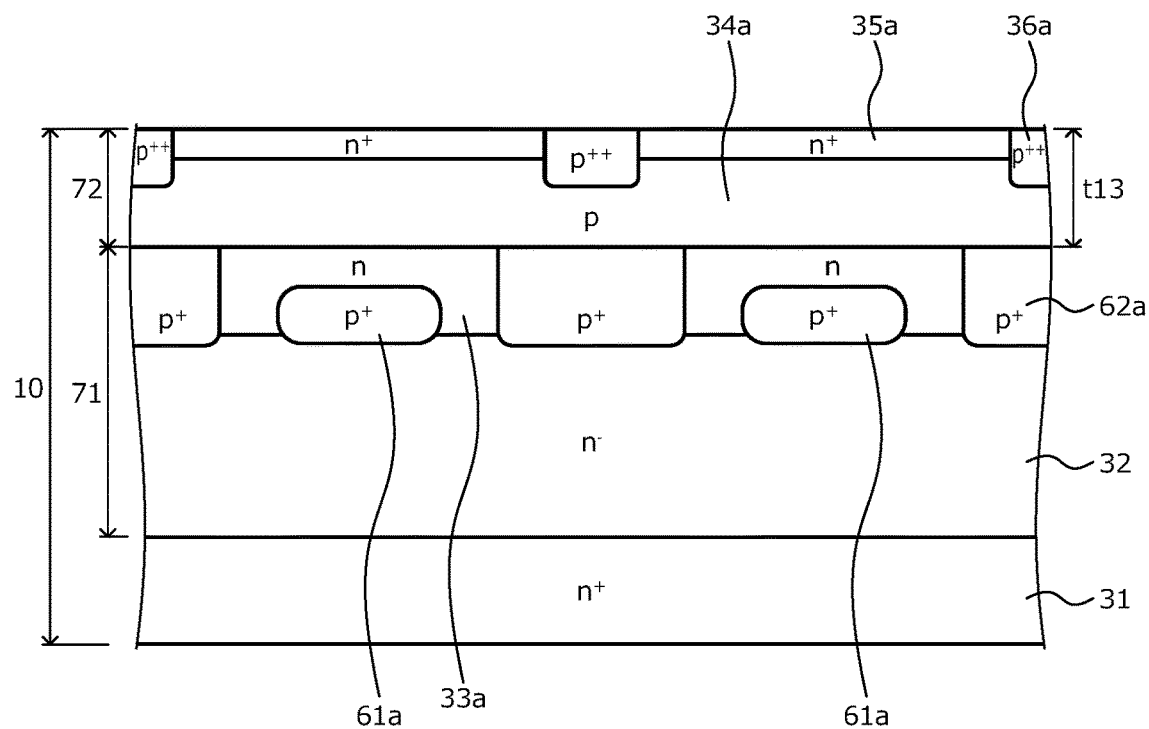
FIG. 8 is a cross-sectional view of the semiconductor device according to the first embodiment during manufacture.

Next, as depicted in FIG. 8, on the $n^-$-type silicon carbide layer 71, for example, the p-type silicon carbide layer 72 doped with a p-type impurity such as Al is formed by epitaxial growth. A thickness t13 and an impurity concentration of the p-type silicon carbide layer 72, for example, may be about 1.3 μm and about $4.0\times10^{17}/cm^3$, respectively. As a result, the semiconductor substrate (semiconductor wafer) 10 in which the $n^-$-type silicon carbide layer 71 and the p-type silicon carbide layer 72 are sequentially stacked on the $n^+$-type starting substrate 31 by epitaxial growth is formed.

Next, a process including photolithography, ion implantation, and removal of the ion implantation mask as one set is repeatedly performed under different conditions, thereby selectively forming in the p-type silicon carbide layer 72 in the main effective region 1a, the $n^+$-type source regions 35a, the $p^{++}$-type contact regions 36a, and the $n^-$-type region 32a (refer to FIG. 2). A region of the main non-operating region 1b directly beneath the OC pad 22 and the main effective region 1a are separated from each other by the $n^-$-type region 32a.

A sequence in which the $n^+$-type source regions 35a, the $p^{++}$-type contact regions 36a, and the $n^-$-type region 32a are formed may be interchanged. In the main effective region 1a, a portion sandwiched by the $n^+$-type source regions 35a, the $p^{++}$-type contact regions 36a, and the $n^-$-type silicon carbide layer 71 is the p-type base region 34a. In the ion implantations described above, for example, a resist film or an oxide film may be used as an ion implantation mask.

Next, with respect to diffusion regions (the first and the second $p^+$-type regions 61a, 62a, the n-type current spreading region 33a, the $n^+$-type source regions 35a, the $p^{++}$-type contact regions 36a, and the $n^-$-type region 32a) formed by ion implantation, for example, a heat treatment (activation annealing) for impurity activation is performed at a temperature of about 1700 degrees C. for about 2 minutes. The activation annealing may be performed once for all of the diffusion regions collectively after formation or may be performed each ion implantation for forming the diffusion regions.

Figure 9:
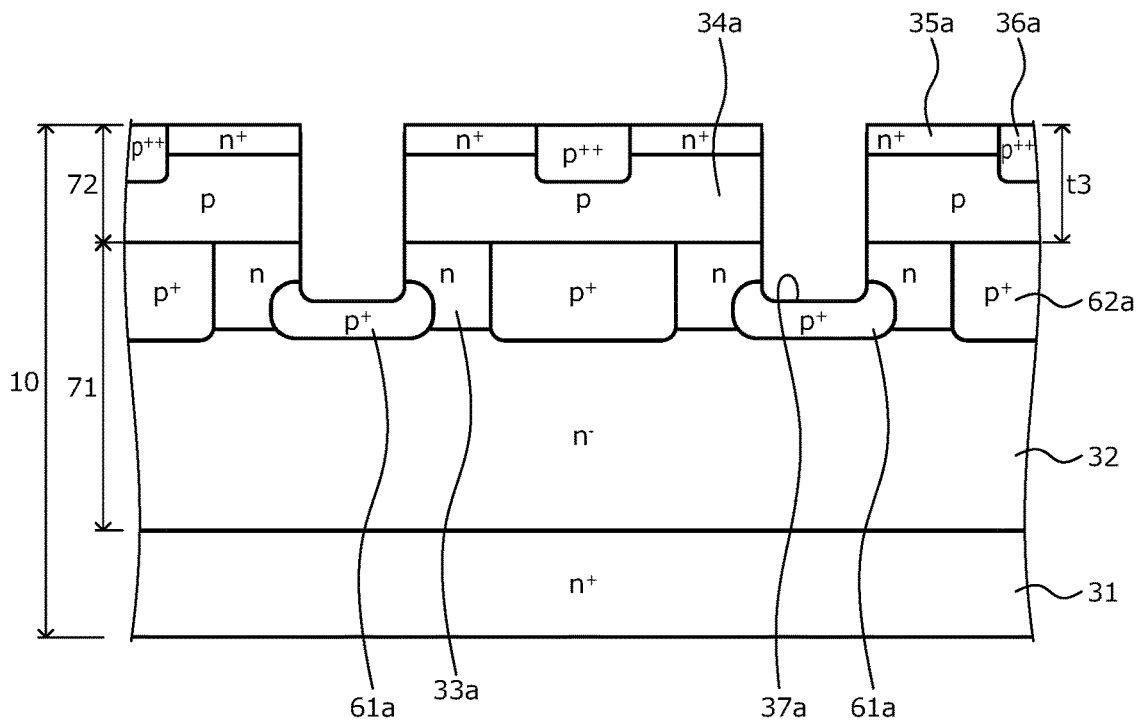
FIG. 9 is a cross-sectional view of the semiconductor device according to the first embodiment during manufacture.

Next, as depicted in FIG. 9, by photolithography and, for example, dry etching, the trenches 37a that penetrate through the $n^+$-type source regions 35a and the p-type base region 34a are formed. The trenches 37a, for example, have a depth reaching the first $p^+$-type regions 61a in the n-type current spreading region 33a. As an etching mask for forming the trenches 37a, for example, a resist mask or an oxide mask may be used. Subsequently, the etching mask is removed.

Figure 10:
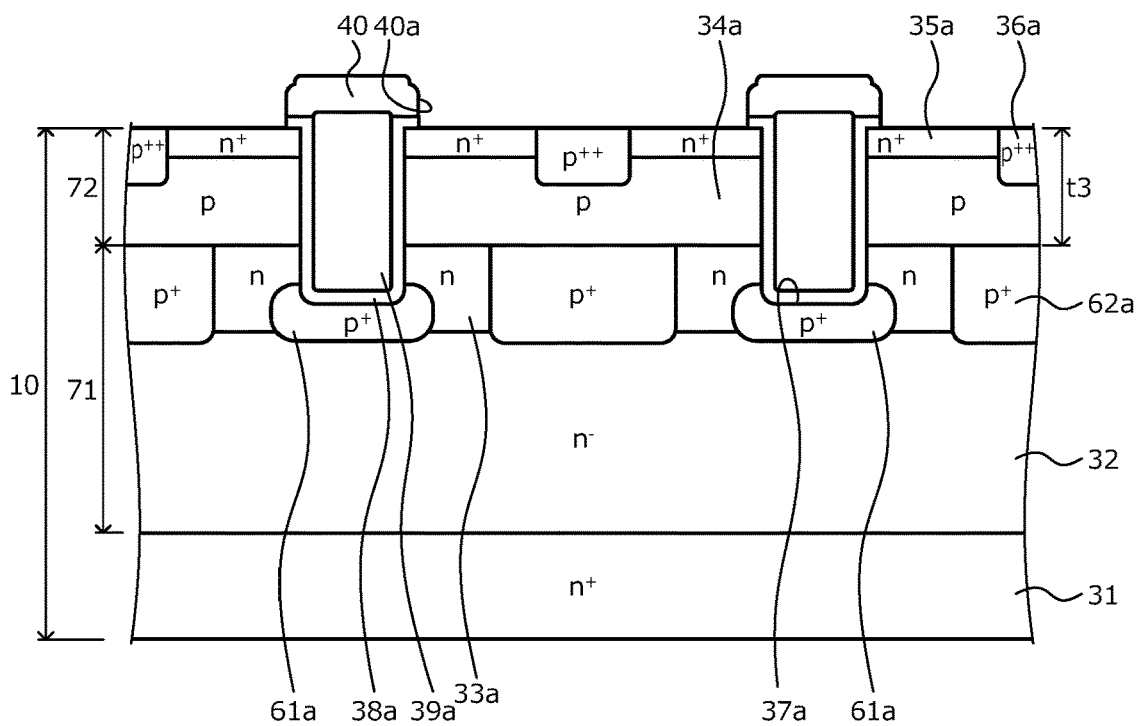
FIG. 10 is a cross-sectional view of the semiconductor device according to the first embodiment during manufacture.

Next, as depicted in FIG. 10, the gate insulating film 38a is formed along the surface of the semiconductor substrate 10 and inner walls of the trenches 37a. The gate insulating film 38a, for example, may be a thermal oxide film formed by a temperature of about 1000 degrees C. in an oxygen ($O_2$) atmosphere, or a deposited film of a high temperature oxide (HTO). Next, in the trenches 37a, on the gate insulating film 38a, for example, a polysilicon layer doped with phosphorus is formed as the gate electrodes 39a.

All elements (for example, the current sensing portion 12, for example, a diffusion diode forming the over-voltage protecting portion, a complementary MOS (CMOS) configuring the arithmetic circuit portion) other than the main semiconductor element 11, suffice to be formed in the main non-operating region 1b of the semiconductor substrate 10, concurrently with the corresponding parts of the main semiconductor element 11 when the parts of the main semiconductor element 11 described above are formed.

For example, diffusion regions of elements disposed on the semiconductor substrate 10 suffice to be formed concurrently with diffusion regions having the same conductivity type, impurity concentration and diffusion depth among the diffusion regions configuring the main semiconductor element 11. Further, gate trenches, gate insulating films, and gate electrodes of elements disposed on the semiconductor substrate 10 suffice to be formed concurrently with the trenches 37a, the gate insulating film 38a, and the gate electrodes 39a of the main semiconductor element 11, respectively. The n$^-$-type region 32b of the main non-operating region 1b suffices to be formed in the main non-operating region 1b of the semiconductor substrate 10, concurrently with the n$^-$-type region 32a of the main effective region 1a.

Next, on the front surface of the semiconductor substrate 10, the field insulating film parts 80a to 80c are formed. Next, on the field insulating film part 80c, for example, a polysilicon layer doped with phosphorus and becoming the n-type polysilicon layer 82 is deposited and a portion of the polysilicon layer is set as a p-type region, thereby forming the p-type polysilicon layer 81. Next, the polysilicon layer is patterned, leaving only portions forming the p-type polysilicon layer 81 and the n-type polysilicon layer 82. The gate runner (not depicted) may be formed concurrently with the p-type polysilicon layer 81 and the n-type polysilicon layer 82.

Next, on the front surface of the semiconductor substrate 10 overall, the interlayer insulating films 40, 83 are formed. The interlayer insulating films 40, 83, for example, may be a phosphosilicate glass (PSG). A thickness of the interlayer insulating films 40, 83, for example, may be about 1 μm. Next, by photolithography and etching, the interlayer insulating film 40 and the gate insulating films 38a, 38b are selectively removed, forming the first and the second contact holes 40a, 40b.

Here, the first contact holes 40a exposing the n$^+$-type source regions 35a and the p$^{++}$-type contact regions 36a of the main semiconductor element 11 are formed. The second contact holes 40b exposing the n$^+$-type source regions 35b and the p$^{++}$-type contact regions 36b of the current sensing portion 12 are formed in the sensing effective region 12a. Next, by a heat treatment, the interlayer insulating films 40, 83 are planarized (reflow).

Next, for example, by sputtering, the first TiN films 42a, 42b are formed on the front surface of the semiconductor substrate 10 overall. The first TiN films 42a, 42b cover the entire surfaces of the interlayer insulating films 40, 83 and portions (the n$^+$-type source regions 35a, 35b and the p$^{++}$-type contact regions 36a, 36b) of the front surface of the semiconductor substrate 10 exposed by the first and the second contact holes 40a, 40b.

Next, by photolithography and etching, portions of the first TiN films 42a, 42b covering the semiconductor substrate 10 in the first and the second contact holes 40a, 40b are removed, again exposing the n$^+$-type source regions 35a, 35b and the p$^{++}$-type contact regions 36a, 36b. As a result, the first TiN films 42a, 42b are left as the barrier metals 46a, 46b on the entire surfaces of the interlayer insulating films 40, 83.

Next, for example, by sputtering, on semiconductor portions (the front surface of the semiconductor substrate 10) exposed by the first and the second contact holes 40a, 40b, a Ni film (not depicted) is formed. Here, the Ni film is further formed on the first TiN films 42a, 42b. Next, for example, by a heat treatment of about 970 degrees C., a silicide is formed where the Ni film is in contact with the semiconductor portions, thereby forming the NiSi films 41a, 41b that are in ohmic contact with the semiconductor portions.

During the heat treatment for converting this nickel into a silicide, the first TiN films 42a, 42b are disposed between the interlayer insulating films 40, 83 and the Ni film, whereby diffusion of nickel atoms in the nickel film into the interlayer insulating films 40, 83 may be prevented. A portion of the Ni film on the interlayer insulating films 40, 83 is not in contact with a semiconductor portion and therefore, is not converted into a silicide. Thereafter, the portion of the Ni film on the interlayer insulating films 40, 83 is removed, exposing the interlayer insulating films 40, 83.

Next, on the back surface of the semiconductor substrate 10, for example, a Ni film is formed. Next, for example, by a heat treatment of about 970 degrees C., the Ni film is converted into a silicide, thereby forming as the drain electrode 51, a NiSi film in ohmic contact with a semiconductor portion (back surface of the semiconductor substrate 10). The heat treatment for silicide conversion when the NiSi film that becomes the drain electrode 51 is formed may be performed concurrently with the heat treatment for forming the NiSi films 41a, 41b of the front surface of the semiconductor substrate 10.

Next, by sputtering, on the front surface of the semiconductor substrate 10, the first Ti films 43a, 43b, the second TiN films 44a, 44b, and the second Ti films 45a, 45b forming the barrier metals 46a, 46b; and an Al film (or an aluminum alloy film) forming the source pad 21a, the gate pad 21b, and the OC pad 22 are sequentially stacked. A thickness of the Al film, for example, is at most about 5 μm.

Next, by photolithography and etching, a metal film deposited on the front surface of the semiconductor substrate 10 is patterned, leaving portions becoming the barrier metals 46a, 46b, the source pad 21a, the gate pad 21b, the OC pad 22, the OV pad (not depicted) of the over-voltage protecting portion, and the electrode pad (not depicted) of the arithmetic circuit portion. Formation of the metal film on the front surface of the semiconductor substrate 10 is performed in a state in which the temperature sensing portion 13, for example, is covered by a resist mask.

Next, after the resist mask covering the temperature sensing portion 13 is removed, by photolithography and etching, the interlayer insulating film 83 is selectively removed, forming the third and the fourth contact holes 83a, 83b, and exposing the p-type polysilicon layer 81 and the n-type polysilicon layer 82 in the third and the fourth contact holes 83a, 83b. Next, by a heat treatment, the interlayer insulating film 83 is planarized.

Next, an Al film (or an aluminum alloy film) is formed on the front surface of the semiconductor substrate 10 so as to be embedded in the third and the fourth contact holes 83a, 83b, whereby the anode pad 23a and the cathode pad 23b of the temperature sensing portion 13 are formed. Next, for example, by sputtering, on the surface of the drain electrode 51, for example, a Ti film, a Ni film, and a gold (Au) film are sequentially stacked, forming the drain pad (not depicted).

Next, for example, the front surface of the semiconductor substrate 10 is protected by a polyimide film by a chemical vapor deposition (CVD) method. Next, by photolithography and etching, the polyimide film is selectively removed, thereby forming and opening the first protective films 49a to 49c that cover electrode pads respectively.

Next, after a general plating pretreatment, the plating films 47a to 47d are formed by a general plating process in portions of the electrode pads 21a, 21b, 22, 23a, 23b exposed in the openings of the first protective films 49a to 49c. Here, the first protective films 49a to 49c function as masks that suppress wet spreading of the plating films 47a to 47d. A thickness of the plating films 47a to 47d, for example, may be about 5 µm.

Next, for example, by a CVD method, a polyimide film becoming the second protective films 50a to 50c that cover each of the borders between the plating films 47a to 47d and the first protective films 49a to 49c is formed. Next, the terminal pins 48a to 48d are bonded on the plating films 47a to 47d by respective solder layers (not depicted). Here, the second protective films 50a to 50c function as masks that suppress wet spreading of the solder layers.

Thereafter, the semiconductor substrate 10 is diced (cut) into individual chips, whereby the semiconductor device 20 depicted in FIGS. 1 to 3 is completed.

As described above, according to the first embodiment, unit cells of the current sensing portion are disposed in a portion directly beneath the OC pad of the main non-operating region of the active region as the sensing effective region and directly beneath the OC pad of the main non-operating region, a region surrounding a periphery of the sensing effective region is set as the sensing non-operating region in which no unit cells of the current sensing portion are disposed. In the sensing non-operating region, the floating p-type base region is disposed. As a result, directly beneath the OC pad of the main non-operating region, a parasitic diode is formed only in the sensing effective region and no parasitic diode is formed in the sensing non-operating region.

In other words, between the parasitic diode of the main semiconductor element of the main effective region and the parasitic diode of the current sensing portion of the sensing effective region, the sensing non-operating region in which no parasitic diode is formed is present. Therefore, the main semiconductor element and the current sensing portion concurrently switch from OFF to ON and when the main semiconductor element and the parasitic diode of the current sensing portion concurrently turn OFF, hole current (reverse recovery current of the parasitic diode of the main semiconductor element) generated in the main effective region may be suppressed from flowing into the current sensing portion and the reverse recovery capability of the parasitic diode in the main non-operating region may be enhanced.

Further, according to the first embodiment, in the sensing non-operating region, the p-type base region is disposed in a surface region of the front surface of the semiconductor substrate, whereby in the sensing non-operating region, electric field may be made uniform at the front surface of the semiconductor substrate, thereby enhancing breakdown voltage. Therefore, in the sensing non-operating region, local concentration of electric field at the field insulating film may be suppressed, enabling dielectric breakdown of the field insulating film to be suppressed.

Figure 11:
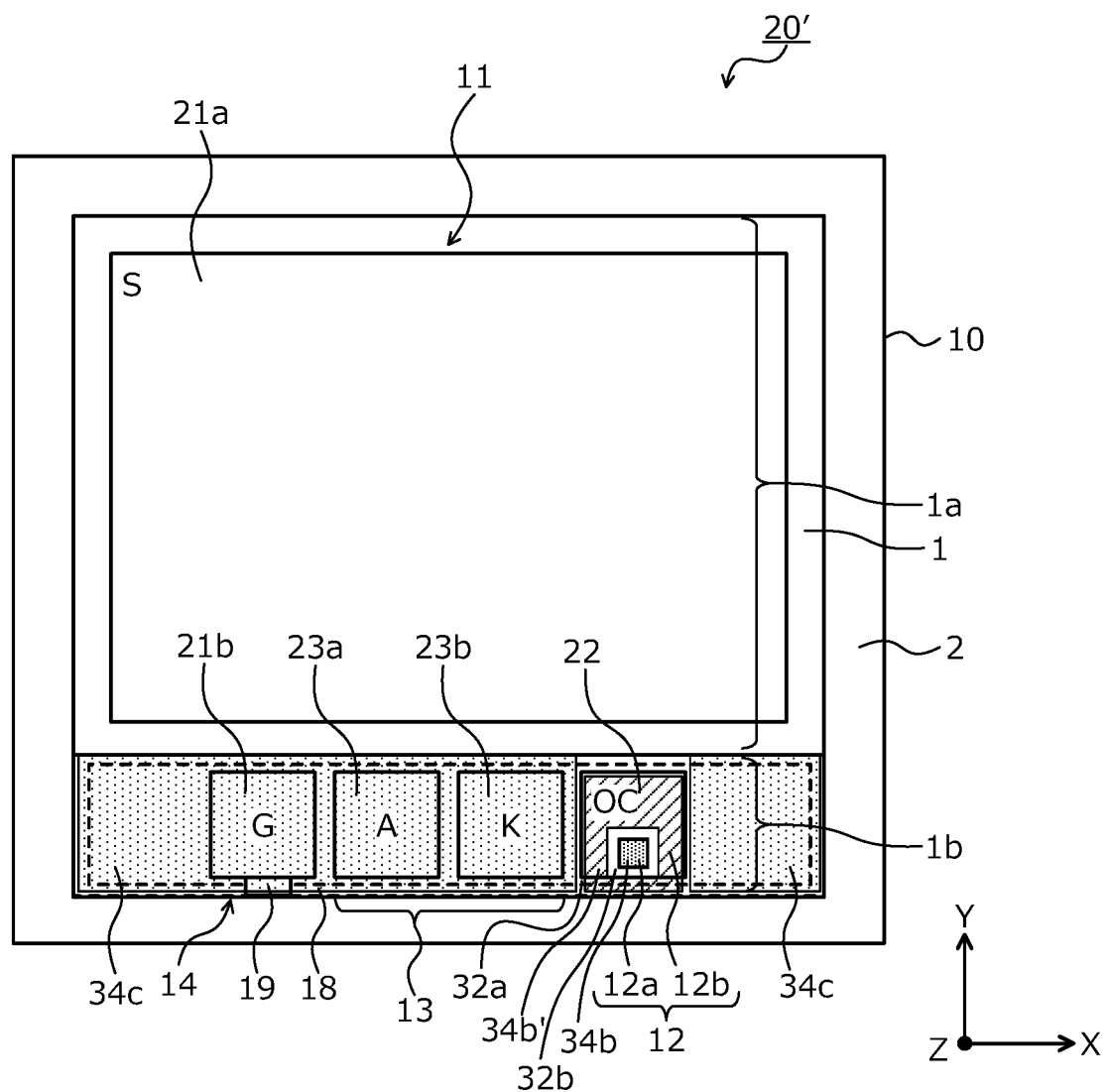
FIG. 11 is a plan view of a layout when a semiconductor device according to a second embodiment is viewed from the front side of the semiconductor substrate.

A semiconductor device according to a second embodiment will be described. FIG. 11 is a plan view of a layout when the semiconductor device according to the second embodiment is viewed from the front side of the semiconductor substrate. A semiconductor device 20' according to the second embodiment differs from the semiconductor device 20 according to the first embodiment (refer to FIGS. 1 to 3) in that a metal electrode (hereinafter, lead-out electrode) 18 is included that leads hole current generated in the n$^-$-type drift region 32 near the main non-operating region 1b out to the grounding point GND of the ground potential.

The lead-out electrode 18, in the main non-operating region 1b, is provided on the front surface of the semiconductor substrate 10 and is electrically connected to the p-type base region 34c. The lead-out electrode 18 is fixed at the electric potential (source potential: the ground potential) of the source pad 21a. The lead-out electrode 18, for example, is provided in an outer periphery of the main non-operating region 1b excluding a portion in which a connecting region 19 of the gate pad 21b and a gate metal electrode (not depicted) is disposed. The gate metal electrode is provided on the gate runner and is a metal layer electrically connected to the gate runner.

The lead-out electrode 18 has a function of leading hole current out to the grounding point GND of the ground potential, via the p-type base region 34c, when the parasitic diodes 16, 17 (refer to FIG. 4) of the active region 1 turn OFF, that is, the hole current that is generated in the n$^-$-type drift region 32 of the edge termination region 2 and the main effective region 1a and that flows into the main non-operating region 1b. In FIG. 11, an inner periphery of the lead-out electrode 18 is indicated by a dashed line. A periphery of the lead-out electrode 18 is the same as a periphery of the main non-operating region 1b.

As described above, according to the second embodiment, effects similar to those of the first embodiment may be obtained. Further, according to the second embodiment, in the main non-operating region, the lead-out electrode that is electrically connected to the p-type base region that is fixed at the source potential is provided, whereby when the parasitic diode of the active region turns OFF, hole current that flows into the main non-operating region may be lead out by the lead-out electrode and therefore, the reverse recovery capability of the parasitic diode in the main non-operating region may be further enhanced.

Figure 12:
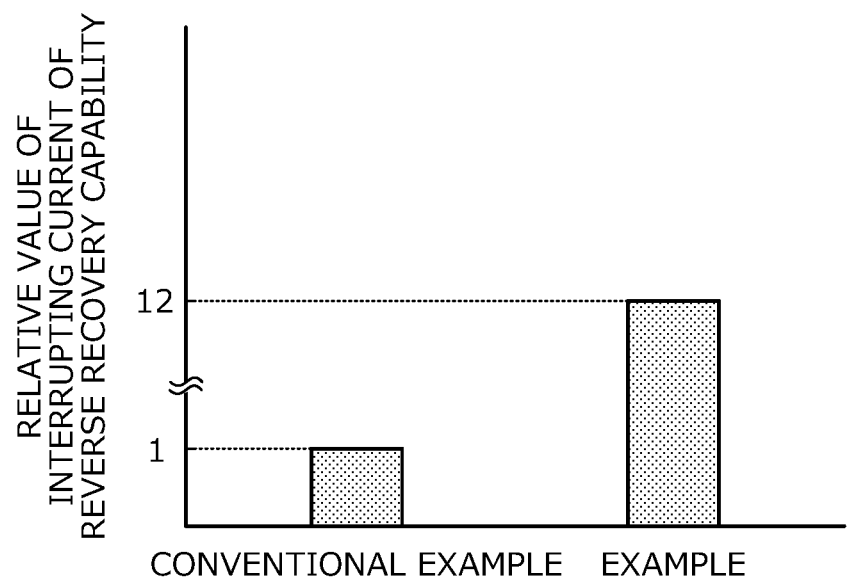
FIG. 12 is a characteristics diagram of amounts of interrupting current due to reverse recovery capability of an example.
Figure 13:
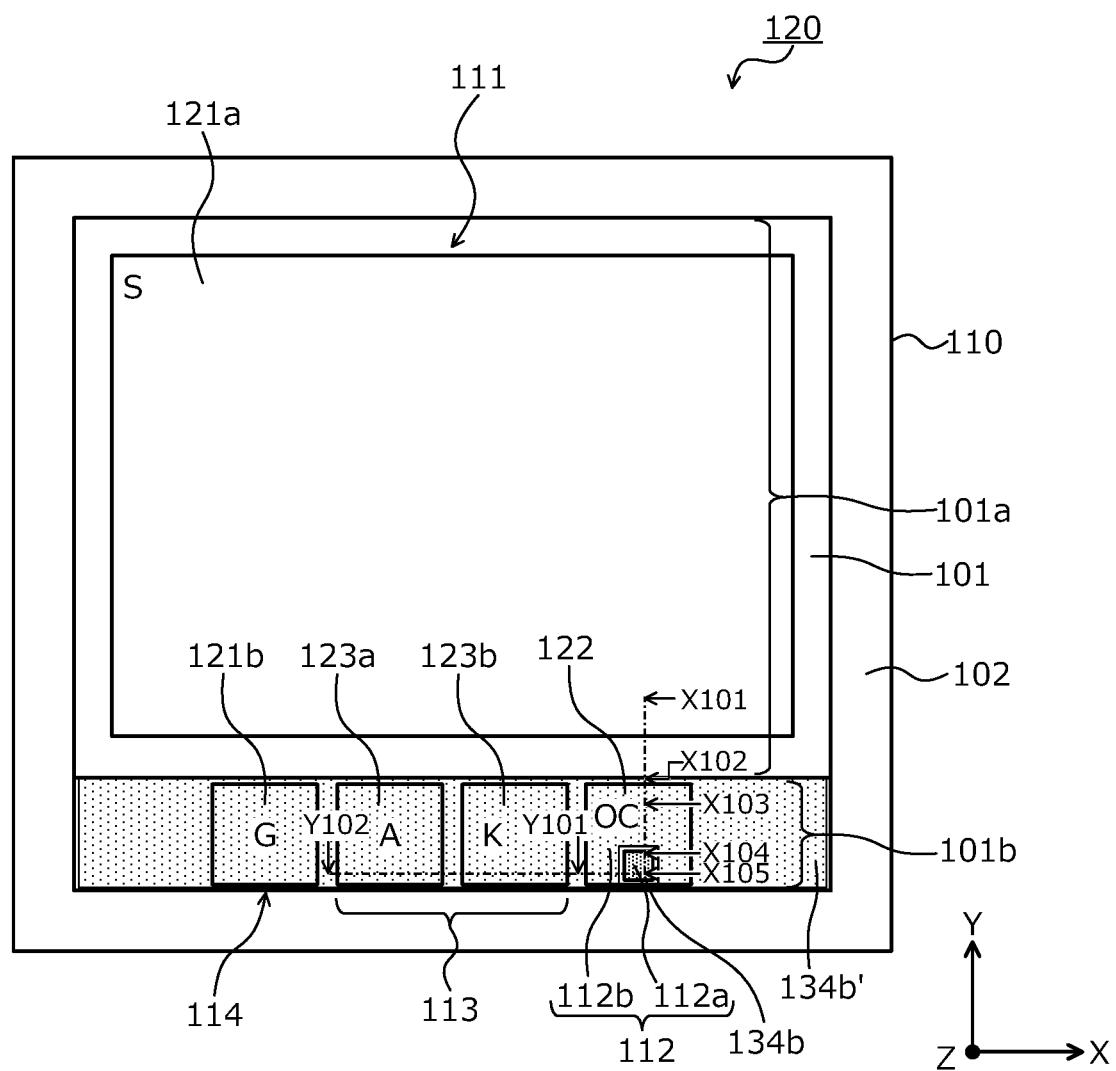
FIG. 13 is a plan view of a layout when a conventional semiconductor device is viewed from a front side of a semiconductor substrate.
Figure 14:
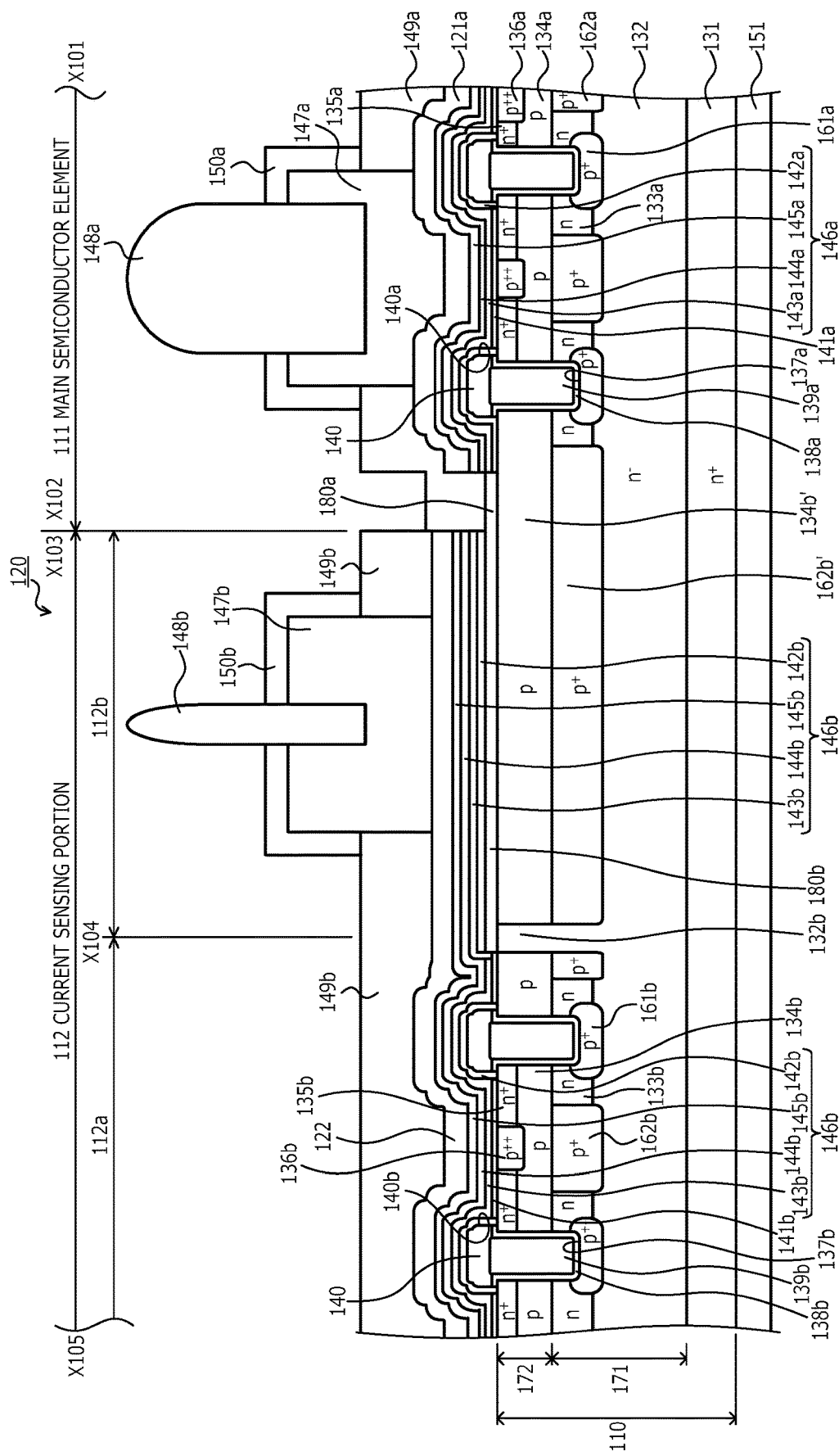
FIG. 14 is a cross-sectional view of a structure of an active region in FIG. 13.
Figure 15:
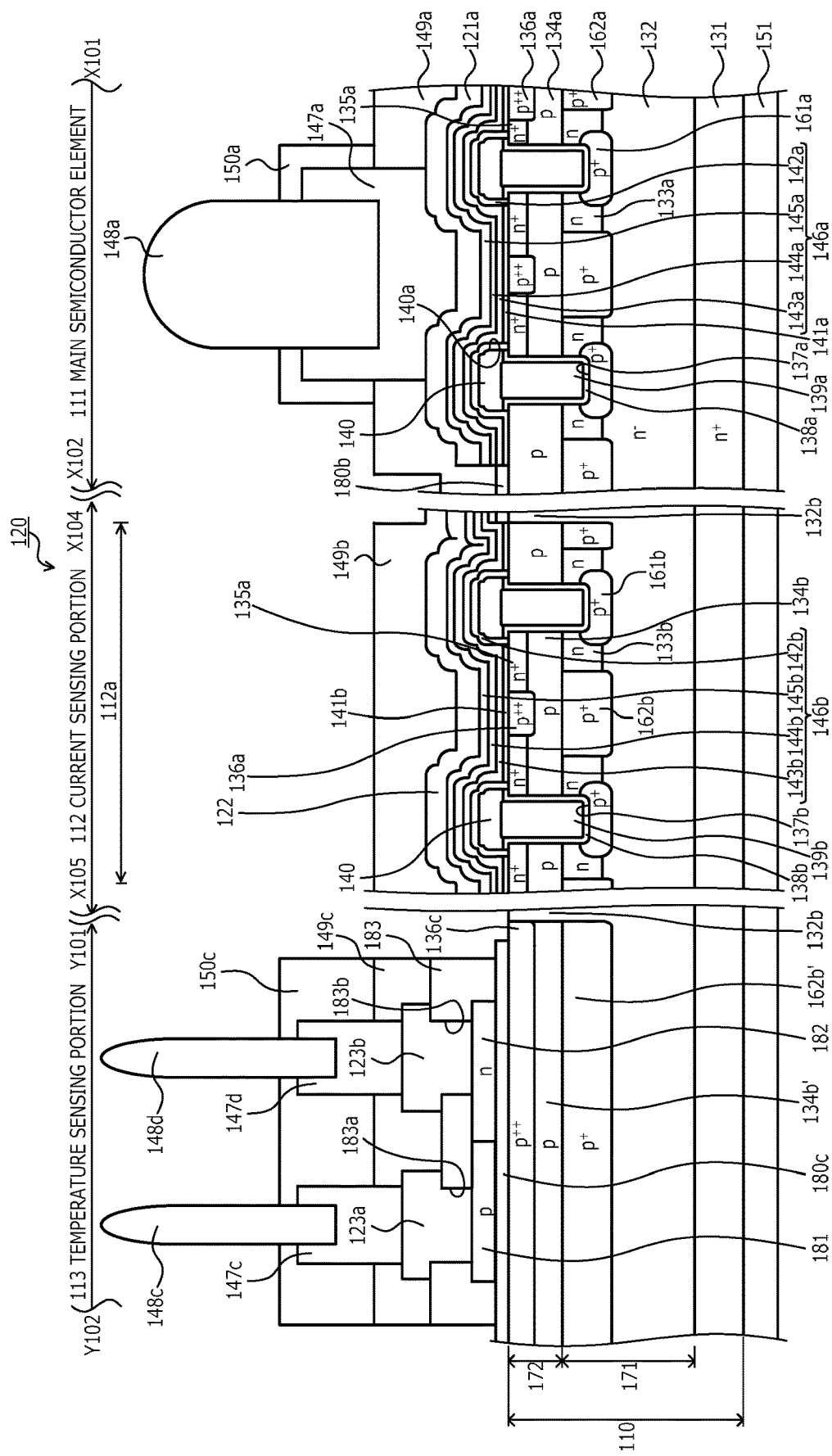
FIG. 15 is a cross-sectional view of the structure of the active region in FIG. 13.

The reverse recovery capability of the semiconductor device 20 according to the first embodiment was examined. FIG. 12 is a characteristics diagram of amounts of interrupting current due to reverse recovery capability of an example. Results of comparison of the amount of hole current (interrupting current) that passes through the p-type base region of the main effective region and that is lead out to the source pad during turn OFF of the parasitic diode of the active region in the semiconductor device 20 according to the first embodiment described above (hereinafter, the example: refer to FIG. 1) and in the conventional semiconductor device 120 (hereinafter, conventional example: refer to FIG. 13) are depicted in FIG. 12.

As depicted in FIG. 12, in the example, it was confirmed that during turn OFF of the parasitic diodes 16, 17 (refer to FIG. 4) of the active region 1, the amount of hole current passing through the p-type base region 34a of the main effective region 1a and lead out to the source pad 21a is greater as compared to that in the conventional example. In the example, the n$^-$-type region 32b is disposed in the main non-operating region 1b so as to surround a periphery of the sensing effective region 12a, whereby the hole current generated near the main non-operating region 1b does not easily flow into the sensing effective region 12a and the reverse recovery capability of the parasitic diode 17 of the main non-operating region 1b is enhanced.

While not depicted, in the semiconductor device 20' according to the second embodiment as well, it was confirmed by the inventor that effects similar to those of the example are obtained.

In the foregoing, the present invention is not limited to the embodiments described above and various modifications within a range not departing from the spirit of the invention are possible. For example, in the main non-operating region, the floating p-type base region extends from the sensing non-operating region to a region excluding that directly beneath the OC pad and has a large surface area, whereby the reverse recovery capability of the parasitic diode formed in the main non-operating region may be increased. In this case, in the main non-operating region, the surface area of the p-type base region fixed at the source potential of the main semiconductor element is smaller by the amount that the surface area of the floating p-type base region is increased. Further, in the main non-operating region, the p-type base region fixed at the source potential of the main semiconductor element may extend directly beneath the OC pad.

In the main non-operating region, the ratio of the surface area of the floating p-type base region to the surface area of the p-type base region fixed at the source potential of the main semiconductor element, for example, suffices to be determined by a tradeoff relationship between the reverse recovery capability and the forward voltage of the parasitic diode formed in the main non-operating region. Further, for example, instead of the trench gate structure, a planar gate structure may be provided. The present invention is further applicable in cases where instead of silicon carbide for the semiconductor material, a wide bandgap material other than silicon carbide is used as a semiconductor material. Further, the present invention is similarly implemented when the conductivity types (n-type, p-type) are reversed.

The semiconductor device according to the present invention achieves an effect in that in a semiconductor device including a current sensing portion on a single semiconductor substrate having a main semiconductor element, the reverse recovery capability of a parasitic diode may be enhanced.

As described above, the semiconductor device according to the present invention is useful for semiconductor devices that include a current sensing portion on a single semiconductor substrate having a main semiconductor element and is particularly suitable for semiconductor devices needing a surface area of a main non-operating region that does not function as the main semiconductor element to be set largely.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate containing a semiconductor having a bandgap wider than that of silicon, and having a first main surface and a second main surface opposite to the first main surface, the semiconductor substrate having first and second effective regions and a non-operating region that excludes the first and second effective regions;
a first first-conductivity-type region of a first conductivity type, provided in the semiconductor substrate;
a first second-conductivity-type region of a second conductivity type, provided between the first main surface of the semiconductor substrate and the first first-conductivity-type region at the first effective region;
a first insulated gate field effect transistor provided in the first effective region and having the first first-conductivity-type region as a drift region and the first second-conductivity-type region as a base region, the first insulated gate field effect transistor having a plurality of unit cells each having a cell structure;
a first source pad of the first insulated gate field effect transistor, provided on the first main surface of the semiconductor substrate and electrically connected to the first second-conductivity-type region;
a second second-conductivity-type region of the second conductivity type, provided between the first main surface of the semiconductor substrate and the first first-conductivity-type region, at the second effective region;
a second insulated gate field effect transistor, provided in the second effective region and having the first first-conductivity-type region as a drift region and the second second-conductivity-type region as a base region, the second insulated gate field effect transistor having a plurality of unit cells each having a cell structure same as the cell structure of each of the unit cells of the first insulated gate field effect transistor, a quantity of the plurality of unit cells of the second insulated gate field effect transistor being smaller than a quantity of the plurality of unit cells of the first insulated gate field effect transistor;
a second source pad of the second insulated gate field effect transistor, provided on the first main surface of the semiconductor substrate separate from the first source pad and electrically connected to the second second-conductivity-type region;
a third second-conductivity-type region of the second conductivity type provided at the non-operating region, being discontinuously provided from the first second-conductivity-type region and the second second-conductivity-type region to have a floating potential, and surrounding a periphery of the second effective region, the third second-conductivity-type region being provided between the first main surface of the semiconductor substrate and the first first-conductivity-type region; and
a drain electrode common to the first insulated gate field effect transistor and the second insulated gate field effect transistor and electrically connected to the second main surface of the semiconductor substrate.

2. The semiconductor device according to claim 1, further comprising
a second first-conductivity-type region of the first conductivity type, surrounding a periphery of the second second-conductivity-type region and being provided between the second second-conductivity-type region and the third second-conductivity-type region, wherein
a surface area of the second first-conductivity-type region is greater than a surface area of the second effective region.

3. The semiconductor device according to claim 1, wherein
a length of an interval between the second second-conductivity-type region and the third second-conductivity-type region in a direction parallel to the first main surface is at least 0.1 µm.

4. The semiconductor device according to claim 1, wherein
the second effective region is provided directly beneath the second source pad, and
the third second-conductivity-type region is provided directly beneath the second source pad and is free of the second effective region.

5. The semiconductor device according to claim 1, further comprising:
one or more electrode pads each provided on the first main surface of the semiconductor substrate in the non-operating region, separate from the first source pad and the second source pad; and
a fourth second-conductivity-type region of the second conductivity type, electrically connected to the first second-conductivity-type region and provided between the first main surface of the semiconductor substrate and the first first-conductivity-type region so as to be directly beneath all of the one or more electrode pads and separate from the third second-conductivity-type region.

6. The semiconductor device according to claim 5, wherein
the one or more electrode pads include a gate pad of the first insulated gate field effect transistor.

7. The semiconductor device according to claim 5, further comprising
a diode that detects a temperature of the first insulated gate field effect transistor, wherein
the one or more electrode pads include an electrode pad of the diode.

8. The semiconductor device according to claim 5, further comprising
a diode that protects the first insulated gate field effect transistor from overvoltage, wherein
the one or more electrode pads include an electrode pad of the diode.

9. The semiconductor device according to claim 1, wherein
the second insulated gate field effect transistor detects overcurrent flowing in the first insulated gate field effect transistor.

* * * * *